(12) United States Patent
Park et al.

(10) Patent No.: US 12,727,335 B2
(45) Date of Patent: Sep. 1, 2026

(54) DISPLAY PANEL AND MANUFACTURING METHOD FOR THE SAME

(71) Applicant: Samsung Display Co., LTD., Yongin-si (KR)

(72) Inventors: Joonyong Park, Yongin-si (KR); Hyuneok Shin, Yongin-si (KR); Sukyoung Yang, Yongin-si (KR); Dongmin Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 309 days.

(21) Appl. No.: 18/410,194

(22) Filed: Jan. 11, 2024

(65) Prior Publication Data

US 2024/0357870 A1 Oct. 24, 2024

(30) Foreign Application Priority Data

Apr. 20, 2023 (KR) ........................ 10-2023-0052163

(51) Int. Cl.
*H10K 59/122* (2023.01)
*H10K 59/12* (2023.01)

(52) U.S. Cl.
CPC ....... *H10K 59/122* (2023.02); *H10K 59/1201* (2023.02)

(58) Field of Classification Search
CPC ....................... H10K 59/122; H10K 59/80522
See application file for complete search history.

(56) References Cited

U.S. PATENT DOCUMENTS

| | | | | |
|---|---|---|---|---|
| 11,348,983 | B1 | 5/2022 | Choung et al. | |
| 2022/0077251 | A1 | 3/2022 | Choung et al. | |
| 2022/0077252 | A1 | 3/2022 | Choung et al. | |
| 2022/0149143 | A1 | 5/2022 | Lee et al. | |
| 2022/0344417 | A1 | 10/2022 | Choung et al. | |
| 2024/0172482 | A1* | 5/2024 | Park .................. | H10K 59/1201 |
| 2024/0276787 | A1* | 8/2024 | Bae .................... | H10K 59/1201 |

FOREIGN PATENT DOCUMENTS

| | | |
|---|---|---|
| KR | 20220065165 A | 5/2022 |

* cited by examiner

*Primary Examiner* — Matthew L Reames
(74) *Attorney, Agent, or Firm* — CANTOR COLBURN LLP

(57) ABSTRACT

A display panel includes a base layer, a pixel-defining film which is disposed on the base layer, and in which a light-emitting opening is defined, a partition wall which is disposed on the pixel-defining film, and in which a partition wall opening corresponding to the light-emitting opening is defined, and a light-emitting element disposed in the partition wall opening and including an anode, an intermediate layer, and a cathode in contact with the partition wall. The partition wall includes a first partition wall layer having first metal including at least one of germanium or copper, aluminum, and nickel, and a second partition wall layer disposed on the first partition wall layer, and including second metal or a silicon-based compound.

21 Claims, 17 Drawing Sheets

FIG. 6

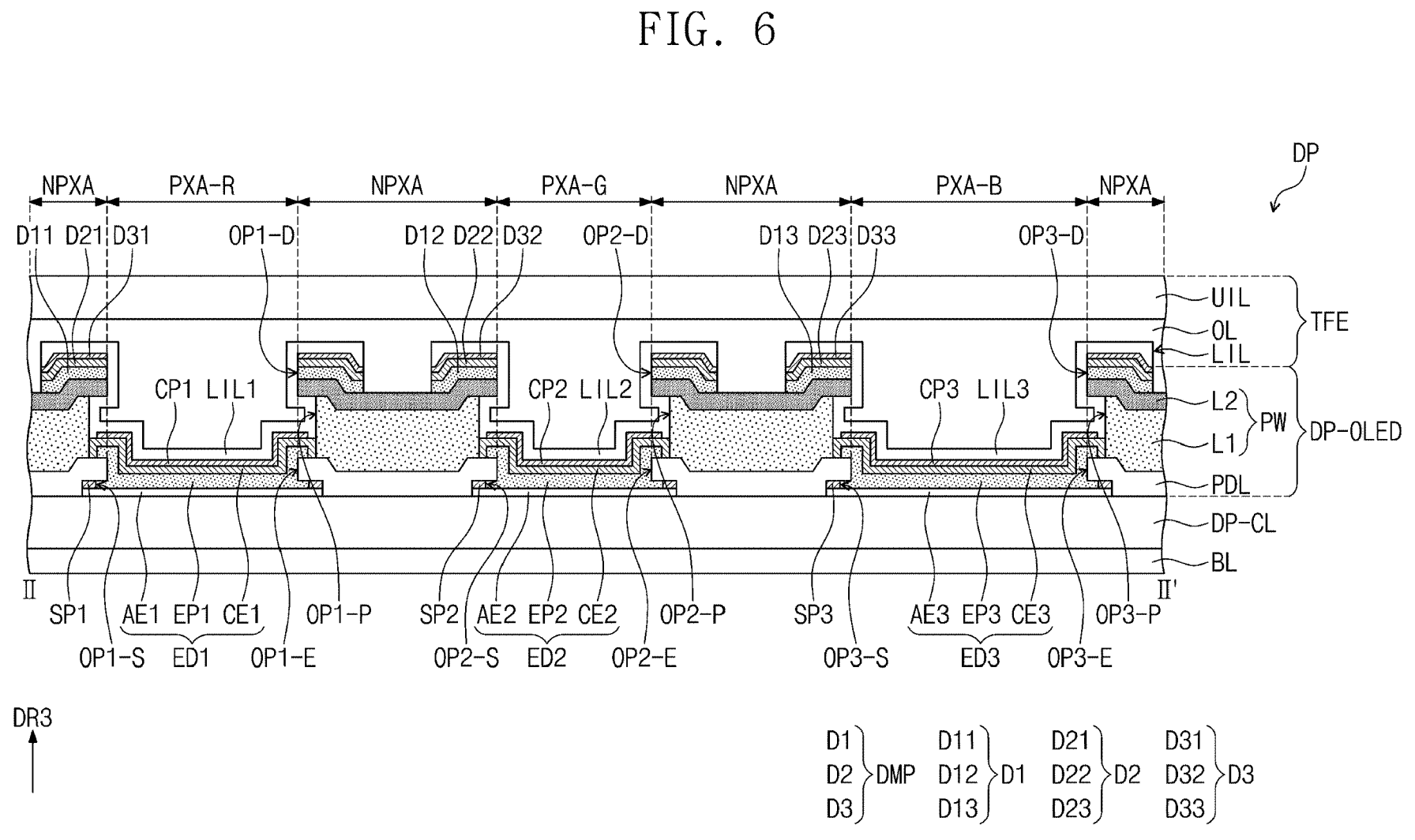

DP
TFE
DP-OLED
UIL
OL
LIL
L2
L1
PW
PDL
DP-CL
BL
II'
II
NPXA
PXA-B
PXA-G
PXA-R
OP3-D
OP2-D
OP1-D
D33
D23
D13
D32
D22
D12
D31
D21
D11
OP3-P
OP3-E
CE3
EP3
AE3
ED3
LIL3
CP3
OP3-S
SP3
OP2-P
OP2-E
CE2
EP2
AE2
ED2
LIL2
CP2
OP2-S
SP2
OP1-P
OP1-E
CE1
EP1
AE1
ED1
LIL1
CP1
OP1-S
SP1
D1 D2 D3 DMP
D11 D12 D13 D1
D21 D22 D23 D2
D31 D32 D33 D3
DR3

FIG. 7

DISPLAY PANEL AND MANUFACTURING METHOD FOR THE SAME

This application claims priority to Korean Patent Application No. 10-2023-0052163, filed on Apr. 20, 2023, and all the benefits accruing therefrom under 35 U.S.C. § 119, the content of which in its entirety is herein incorporated by reference.

BACKGROUND

1. Field

The disclosure herein relates to a display panel and a manufacturing method for the same, and more particularly, to a display panel with improved display quality.

2. Description of the Related Art

A display device, such as a television, a monitor, a smartphone, and a tablet computer, for providing images to a user, includes a display panel that displays an image. Various display panels, such as a liquid crystal display panel, an organic light-emitting display panel, an electrowetting display panel, and an electrophoretic display panel, are being developed.

The organic light-emitting display panel may include an anode, a cathode, and light-emitting patterns. The light-emitting patterns may be separated for each light-emitting region, and the cathode may provide a common voltage for the light-emitting regions.

SUMMARY

The disclosure provides a display panel in which a light-emitting element is formed without using a metal mask and which has improved process reliability, and a manufacturing method for the same.

An embodiment of the inventive concept provides a display panel including a base layer, a pixel-defining film which is disposed on the base layer, and in which a light-emitting opening is defined, a partition wall which is disposed on the pixel-defining film, and in which a partition wall opening corresponding to the light-emitting opening is defined, and a light-emitting element disposed in the partition wall opening and including an anode, an intermediate layer, and a cathode in contact with the partition wall, where the partition wall includes a first partition wall layer having first metal including at least one of germanium or copper, aluminum, and nickel, and a second partition wall layer disposed on the first partition wall layer, and having second metal or a silicon-based compound.

In an embodiment, a content of the first metal with respect to the entirety of the first partition wall layer may be about 0.1 atomic percentage (at %) to about 0.5 at %.

In an embodiment, a content of the nickel with respect to the entirety of the first partition wall layer may be about 0.5 at % to about 2.0 at %.

In an embodiment, the first partition wall layer may further include lanthanum.

In an embodiment, a content of the lanthanum with respect to the entirety of the first partition wall layer may be about 0.3 at % to about 0.5 at %.

In an embodiment, the second partition wall layer may have an undercut shape protruding from one side of the first partition wall layer.

In an embodiment, the second partition wall layer may include titanium.

In an embodiment, the first partition wall layer may be directly disposed on the pixel-defining film, and the second partition wall layer may be directly disposed on the first partition wall layer.

In an embodiment, the partition wall opening may include a first region in which the light-emitting element is disposed, and a second region having a smaller width than that of the first region, an inner side surface of the first partition wall layer may define the first region, and an inner side surface of the second partition wall layer may define the second region.

In an embodiment, the first partition wall layer may have a thickness of about 6000 angstroms (Å) to about 100000 Å, and the second partition wall layer may have a thickness of about 400 Å to about 800 Å.

In an embodiment, the display panel may further include a sacrificial pattern which is disposed between the anode and the pixel-defining film, and in which a sacrificial opening overlapping the light-emitting opening is defined.

In an embodiment, the cathode may contact the first partition wall layer.

In an embodiment, the display panel may further include a thin-film encapsulation layer disposed on the light-emitting element, and having a plurality of thin films, and the thin-film encapsulation layer may include an inorganic encapsulation pattern which covers the light-emitting element, and a portion of which contacts the partition wall.

In an embodiment of the inventive concept, a display panel includes a base layer, a pixel-defining film which is disposed on the base layer, and in which a light-emitting opening is defined, a partition wall which is disposed on the pixel-defining film, and in which a partition wall opening corresponding to the light-emitting opening is defined, and a light-emitting element disposed in the partition wall opening and including an anode, an intermediate layer, and a cathode in contact with the partition wall, the partition wall includes a first partition wall layer including aluminum, nickel, and first metal having a standard reduction potential higher than that of the nickel, and a second partition wall layer disposed on the first partition wall layer, and having an undercut shape protruding from one side of the first partition wall layer.

In an embodiment, the first partition wall layer may further include lanthanum.

In an embodiment, the first partition wall layer may include an aluminum-nickel-lanthanum-germanium alloy, or an aluminum-nickel-lanthanum-copper alloy.

In an embodiment of the inventive concept, a manufacturing method for a display panel includes providing a preliminary display panel including a base layer, an anode disposed on the base layer, and a preliminary pixel-defining film disposed on the base layer and covering the anode, forming a first preliminary partition wall layer including first metal including at least one of germanium or copper, aluminum, and nickel, forming, on the first preliminary partition wall layer, a second preliminary partition wall layer including second metal or a silicon-based compound, etching the first and second preliminary partition wall layers to form a partition wall in which a partition wall opening is defined, and forming, in the partition wall opening, a light-emitting pattern, and a cathode which contacts the partition wall.

In an embodiment, the forming the partition wall may include performing a first etching on the first and second preliminary partition wall layers, and performing a second etching on the first preliminary partition wall layer by providing an alkaline chemical solution to the first preliminary partition wall layer.

In an embodiment, in the performing the second etching on the first preliminary partition wall layer, a first partition wall layer and a second partition wall layer may be formed, and an inner side surface of the second partition wall layer may be closer to a center of the anode than an inner side surface of the first partition wall layer is to the center of the anode.

In an embodiment, the alkaline chemical solution may include at least one of potassium hydroxide or tetramethylammonium hydroxide.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIG. 6 is a cross-sectional view of an embodiment of a display panel according to the inventive concept:

FIG. 7 is a cross-sectional view of an embodiment of a display panel according to the inventive concept.

DETAILED DESCRIPTION

Figure 1A:
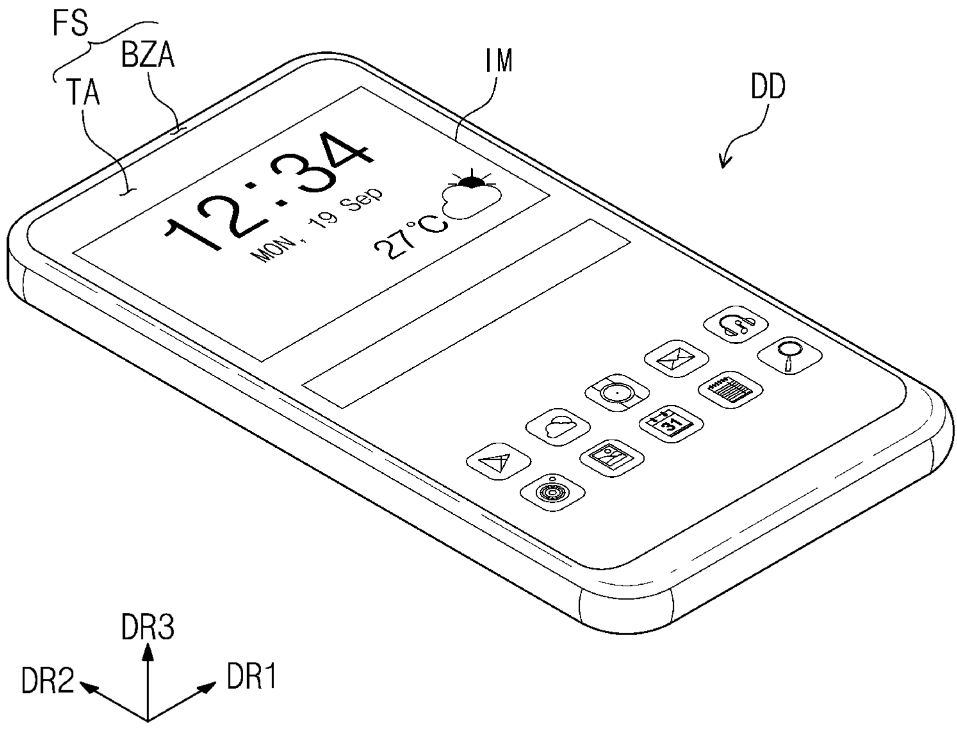
FIG. 1A is a combined perspective view of an embodiment of a display device according to the inventive concept.

Hereinafter, embodiments of the inventive concept will be described with reference to the accompanying drawings.

In this specification, it will be understood that when an element (or a region, a layer, a portion, or the like) is also referred to as being "on", "connected to" or "coupled to" another element, it may be directly disposed on, connected or coupled to the other element, or intervening elements may be disposed therebetween.

Like reference numerals or symbols refer to like elements throughout. In the drawings, the thickness, the ratio, and the size of the element are exaggerated for effective description of the technical contents. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the scope of the inventive concept. Similarly, a second element, component, region, layer or section may be termed a first element, component, region, layer or section. As used herein, the singular forms, "a", "an" and "the" are intended to include the plural forms as well, unless the context clearly indicates otherwise.

Also, terms of "below", "on lower side", "above", "on upper side", or the like may be used to describe the relationships of the elements illustrated in the drawings. These terms have relative concepts and are described on the basis of the directions indicated in the drawings.

It will be further understood that the terms "includes" and/or "have", when used in this specification, specify the presence of stated features, integers, steps, operations, elements, components, and/or groups thereof, but do not preclude the presence or addition of one or more other features, integers, steps, operations, elements, components, and/or groups thereof.

In this specification, when an element, such as a layer, a film, a region, or a substrate, is referred to as being "directly disposed on," "directly connected to" or "directly coupled to" another element, there are no intervening elements, such as a layer, a film, a region, or a substrate, present therebetween. For example, when an element is referred to as being "directly disposed on," two layers or members are disposed without an additional member, such as an adhesion member, being used therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within +30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device in an embodiment of the inventive concept will be described with reference to the accompanying drawings.

Figure 1B:
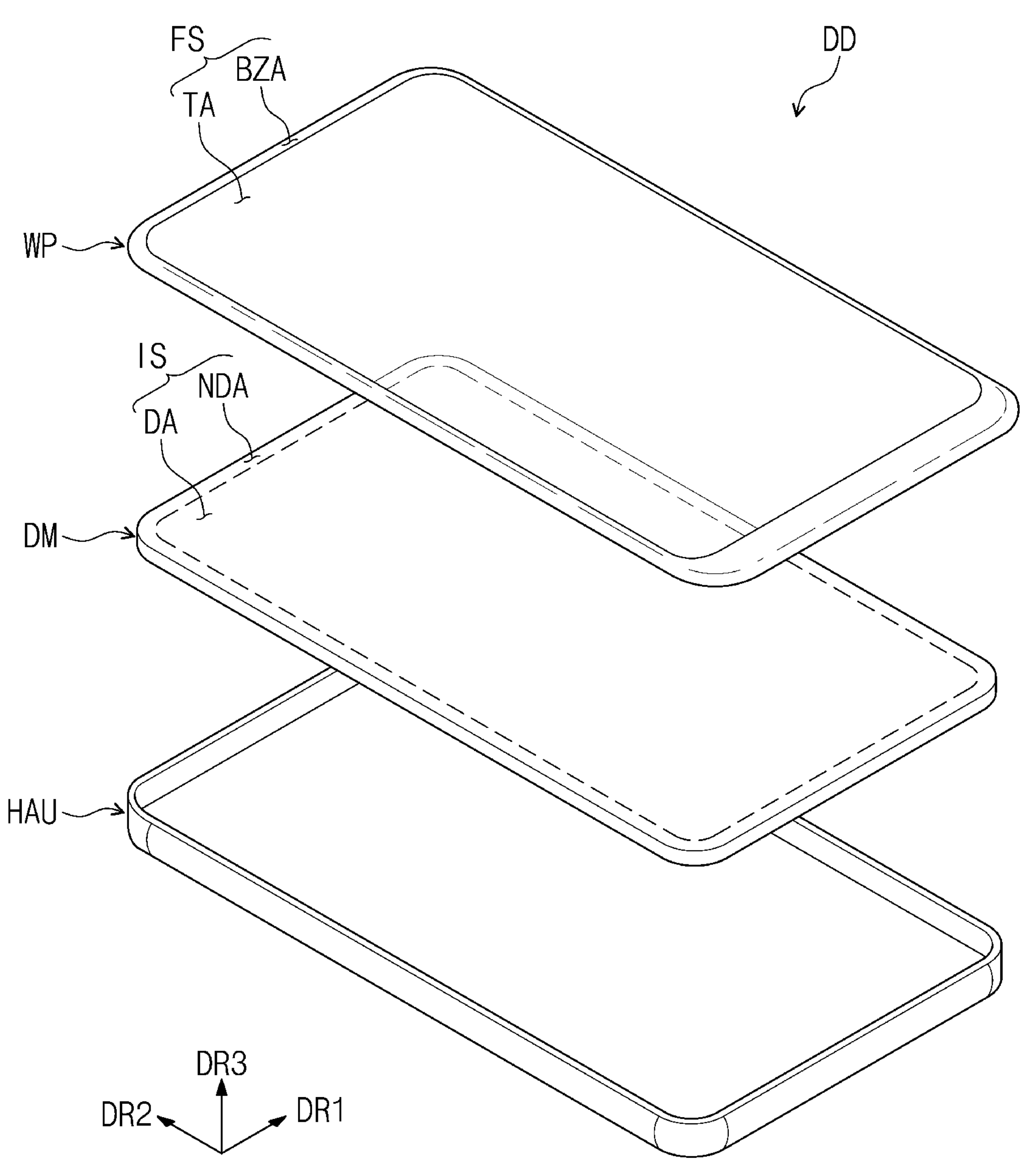
FIG. 1B is an exploded perspective view of an embodiment of a display device according to the inventive concept.
Figure 2:
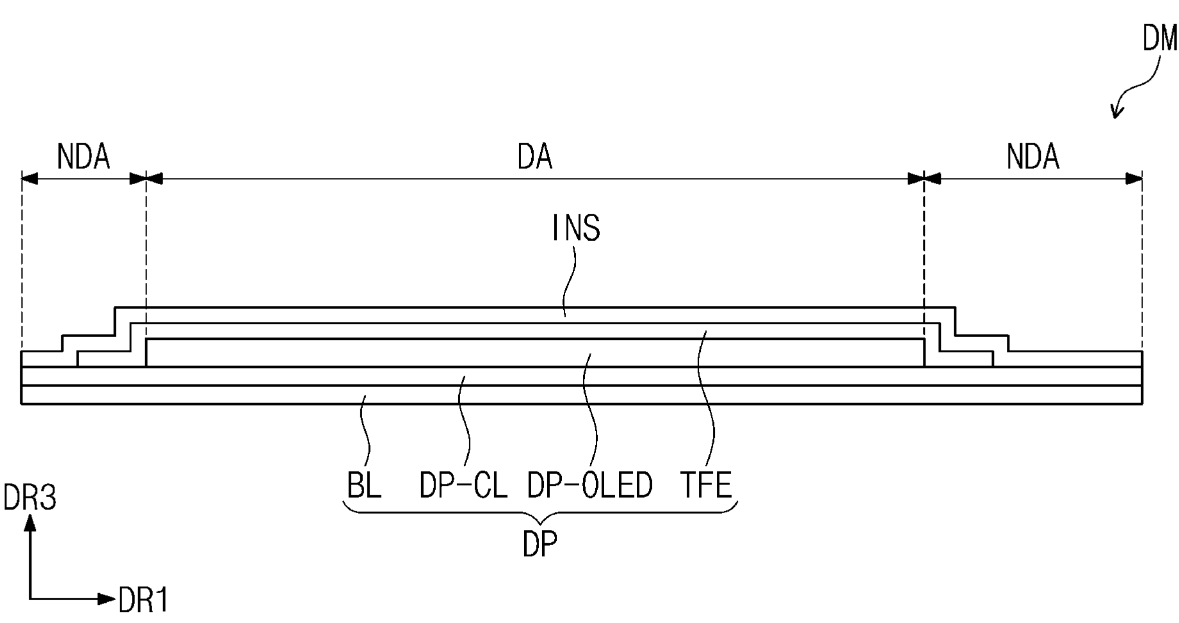
FIG. 2 is a cross-sectional view of an embodiment of a display module according to the inventive concept.

FIG. 1A is a perspective view of an embodiment of a display device according to the inventive concept. FIG. 1B is an exploded perspective view of an embodiment of a display device according to the inventive concept. FIG. 2 is a cross-sectional view of an embodiment of a display panel according to the inventive concept.

In an embodiment, a display device DD may be a large electronic device such as a television, a monitor, or a billboard. In addition, the display device DD may be a small- or medium-size electronic device such as a personal computer, a laptop computer, a personal digital assistant, a car navigation unit, a game console, a smartphone, a tablet computer, and a camera. However, these are presented only as examples, and the display device DD may also be employed as another display device without departing from the scope of the inventive concept. In this embodiment, the display device DD is illustrated as a smartphone.

Referring to FIGS. 1A, 1B, and 2, the display device DD may display an image IM on a display surface FS, parallel to each of a first direction DR1 and a second direction DR2, toward a third direction DR3. The image IM may include a still image as well as a dynamic image. FIG. 1A illustrates a clock and icons in an embodiment of the image IM. The display surface FS on which the image IM is displayed may correspond to a front surface of the display device DD.

In this embodiment, a front surface (or upper surface) and a rear surface (or lower surface) of each of members are defined on the basis of a direction in which the image IM is displayed. The front surface and the rear surface may be opposed to each other in the third direction DR3, and the normal direction of each of the front surface and the rear surface may be parallel to the third direction DR3. Directions indicated by the first to third directions DR1, DR2, and DR3 are relative concepts, and may be changed to other directions. In this specification, to be "a plan view" may refer to a view from the third direction DR3.

As illustrated in FIG. 1B, the display device DD according to this embodiment may include a window WP, a display module DM, and a housing HAU. The window WP and the housing HAU may be coupled to each other to form the exterior of the display device DD.

The window WP may include an optically transparent insulation material. In an embodiment, the window WP may include glass or plastic, for example. A front surface of the window WP may define the display surface FS of the display device DD. The display surface FS may include a transmission region TA and a bezel region BZA. The transmission region TA may be an optically transparent region. In an embodiment, the transmission region TA may be a region having a visible transmittance of about 90% or more, for example.

The bezel region BZA may be a region having a relatively lower light transmittance than that of the transmission region TA. The bezel region BZA may define a shape of the transmission region TA. The bezel region BZA may be adjacent to the transmission region TA, and may surround the transmission region TA. This is illustrated as an illustrative embodiment, and the bezel region BZA may be omitted in the window WP according to the inventive concept. The window WP may include at least one functional layer of an anti-fingerprint layer, a hard-coating layer, or an anti-reflection layer, and is not limited to any particular embodiment of the inventive concept.

The display module DM may be disposed under the window WP. The display module DM may be a component for substantially generating the image IM. The image IM generated in the display module DM is displayed on a display surface IS of the display module DM, and viewed to a user in the outside through the transmission region TA.

The display module DM includes a display region DA and a non-display region NDA. The display region DA may be activated in response to electrical signals. The non-display region NDA is adjacent to the display region DA. The non-display region NDA may surround the display region DA. The non-display region NDA may be a region covered by the bezel region BZA, and may thus be invisible from the outside.

As illustrated in FIG. 1B, the housing HAU may be coupled to the window WP. The housing HAU and the window WP may be coupled to each other and provide a predetermined inner space. The display module DM may be accommodated in the inner space.

The housing HAU may include a material relatively high in rigidity. In an embodiment, the housing HAU may include a plurality of frames and/or plates having glass, plastic, or metal, or composed of any combinations thereof, for example. The housing HAU may stably protect components of the display device DD, accommodated in the inner space, from external impact.

FIG. 2 is a cross-sectional view of an embodiment of a display module according to the inventive concept.

Referring to FIG. 2, a display module DM may include a display panel DP and an input sensor INS. Although not illustrated separately in the drawing, the display device DD (refer to FIG. 1A) in an embodiment of the inventive concept may further include a protection member disposed on a lower surface of the display panel DP, or an anti-reflection member and/or a window member disposed on an upper surface of the input sensor INS.

The display panel DP may be an emission-type display panel. However, this is an illustrative embodiment, and an embodiment of the inventive concept is not particularly limited thereto. In an embodiment, the display panel DP may be an organic light-emitting display panel, or an inorganic light-emitting display panel, for example. A light-emitting layer in the organic light-emitting display panel may include an organic light-emitting material. A light-emitting layer in the inorganic light-emitting display panel may include quantum dots, quantum rods, or a micro-light-emitting diode ("LED"). Hereinafter, the display panel DP will be described as the organic light-emitting display panel.

The display panel DP may include a base layer BL, a circuit element layer DP-CL disposed on the base layer BL, a display element layer DP-OLED, and a thin-film encapsulation layer TFE. The input sensor INS may be directly disposed on the thin-film encapsulation layer TFE. In this specification, "component A directly disposed on component B" means that there is no adhesive layer disposed between component A and component B.

The base layer BL may include at least one plastic film. The base layer BL may be a flexible substrate, and may include a plastic substrate, a glass substrate, a metal substrate, an organic/inorganic composite material substrate, or the like. The display region DA and the non-display region NDA described with reference to FIG. 1B may be defined also in the base layer BL.

The circuit element layer DP-CL may include at least one insulation layer and circuit element. The insulation layer includes at least one inorganic layer and at least one organic layer. The circuit element includes signal lines, a driving circuit of a pixel, etc.

The display element layer DP-OLED may include a partition wall and a light-emitting element. The light-emitting element may include an anode, an intermediate layer, and a cathode.

The thin-film encapsulation layer TFE may include a plurality of thin films. Some thin films may be disposed in order to improve optical efficiency, and other thin films may be disposed in order to protect organic light-emitting diodes.

The input sensor INS acquires coordinate information of an external input. The input sensor INS may have a multi-layer structure. The input sensor INS may include a single-layer or multi-layer conductive layer. In addition, the input sensor INS may include a single-layer or multi-layer insulation layer. The input sensor INS may detect an external input in a capacitive manner. However, this is an illustrative embodiment, and the inventive concept is not limited thereto. In an embodiment, the input sensor INS in an embodiment may also detect an external input by electromagnetic induction or in a pressure sensitive manner, for example. The input sensor INS may be omitted in another embodiment of the inventive concept.

Figure 3A:
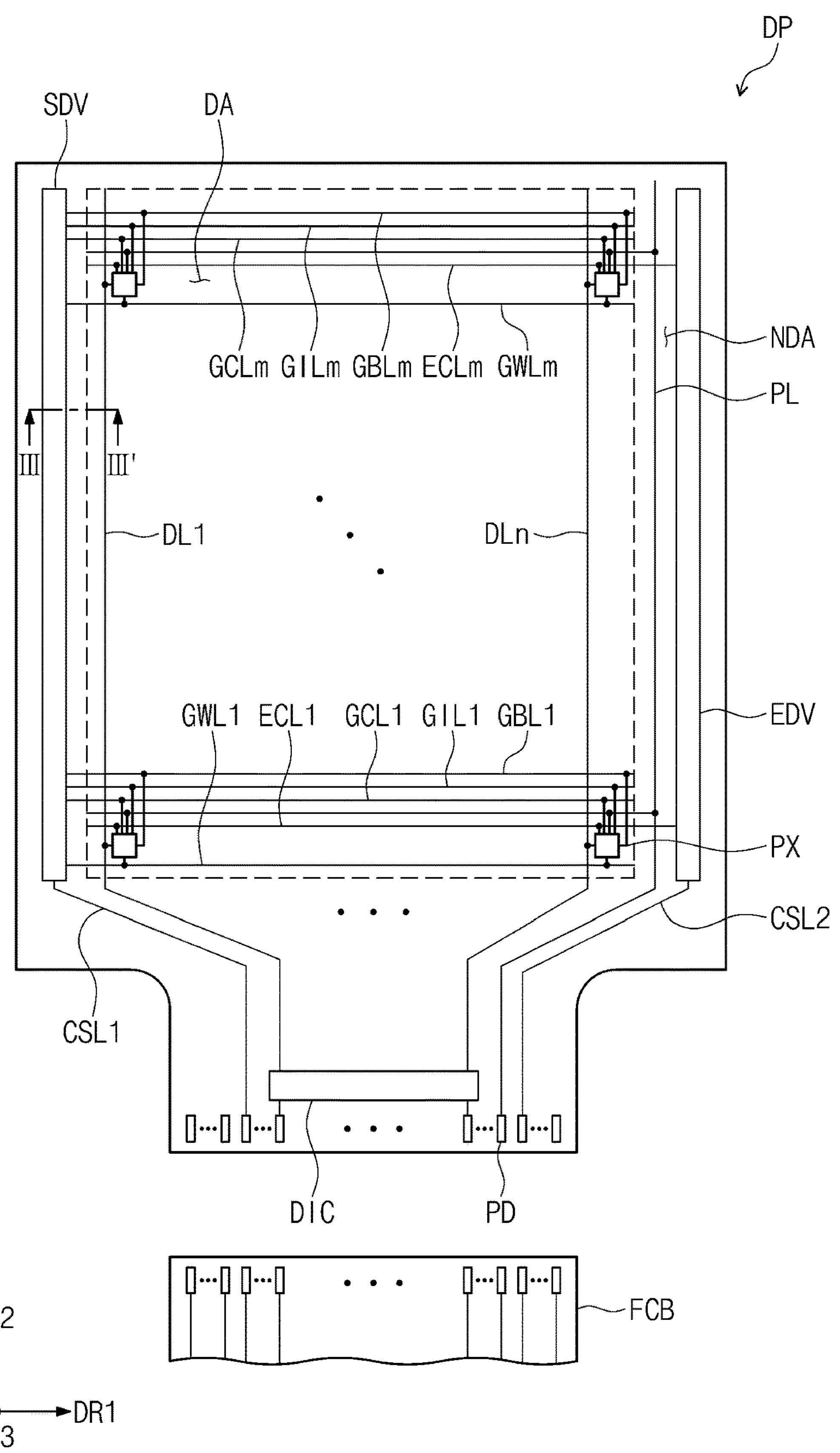
FIG. 3A is a plan view of an embodiment of a display panel according to the inventive concept.

FIG. 3A is a plan view of an embodiment of a display panel according to the inventive concept.

Referring to FIG. 3A, a display region DA and a non-display region NDA around the display region DA may be defined in the display panel DP. The display region DA and the non-display region NDA may be distinguished according to whether a pixel PX is disposed or not. The pixel PX may be disposed in the display region DA. In the non-display region NDA, a scan driver SDV, a data driver, and an emission driver EDV may be disposed. The data driver may be a partial circuit where a driving chip DIC is configured.

The display panel DP may include pixels PX, initialization scan lines GIL1 to GILm, compensation scan lines GCL1 to GCLm, write scan lines GWL1 to GWLm, black scan lines GBL1 to GBLm, emission control lines ECL1 to ECLm, data lines DL1 to DLn, first and second control lines CSL1 and CSL2, a drive voltage line PL, and a plurality of pads PD. Here, m and n are natural numbers greater than or equal to 2.

The pixels PX may be connected to the initialization scan lines GIL1 to GILm, the compensation scan lines GCL1 to GCLm, the write scan lines GWL1 to GWLm, the black scan lines GBL1 to GBLm, the emission control lines ECL1 to ECLm, and the data lines DL1 to DLn.

The initialization scan lines GIL1 to GILm, the compensation scan lines GCL1 to GCLm, the write scan lines GWL1 to GWLm, and the black scan lines GBL1 to GBLm may extend in a first direction DR1 to be electrically connected to the scan driver SDV. The data lines DL1 to DLn may extend in a second direction DR2 to be electrically connected to the driving chip DIC. The emission control lines ECL1 to ECLm may extend in the first direction DR1 to be electrically connected to the emission driver EDV.

The drive voltage line PL may include a portion extending in the first direction DR1 and a portion extending in the second direction DR2. The portion extending in the first direction DR1 and the portion extending in the second direction DR2 may be disposed in different layers. The drive voltage line PL may provide drive voltages to the pixels PX.

The first control line CSL1 may be connected to the scan driver SDV. The second control line CSL2 may be connected to the emission driver EDV.

The driving chip DIC, the drive voltage line PL, the first control line CSL1, and the second control line CSL2 may be electrically connected to the pads PD. A circuit board FCB may be electrically connected to the pads PD through an anisotropic conductive adhesive layer. The pads PD may connect the circuit board FCB to the display panel DP. The pads PD may be connected to the corresponding pixels PX through the drive voltage line PL, the first control line CSL1, and the second control line CSL2.

In addition, the pads PD may further include input pads. The input pads may connect the circuit board FCB to the input sensor INS (refer to FIG. 2). However, the inventive concept is not limited thereto, and the input pads may be disposed on the input sensor INS, and connected to a separate circuit board from that of the pads PD. In an alternative embodiment, the input sensor INS may be omitted, and the input pads may not be included.

Figure 3B:
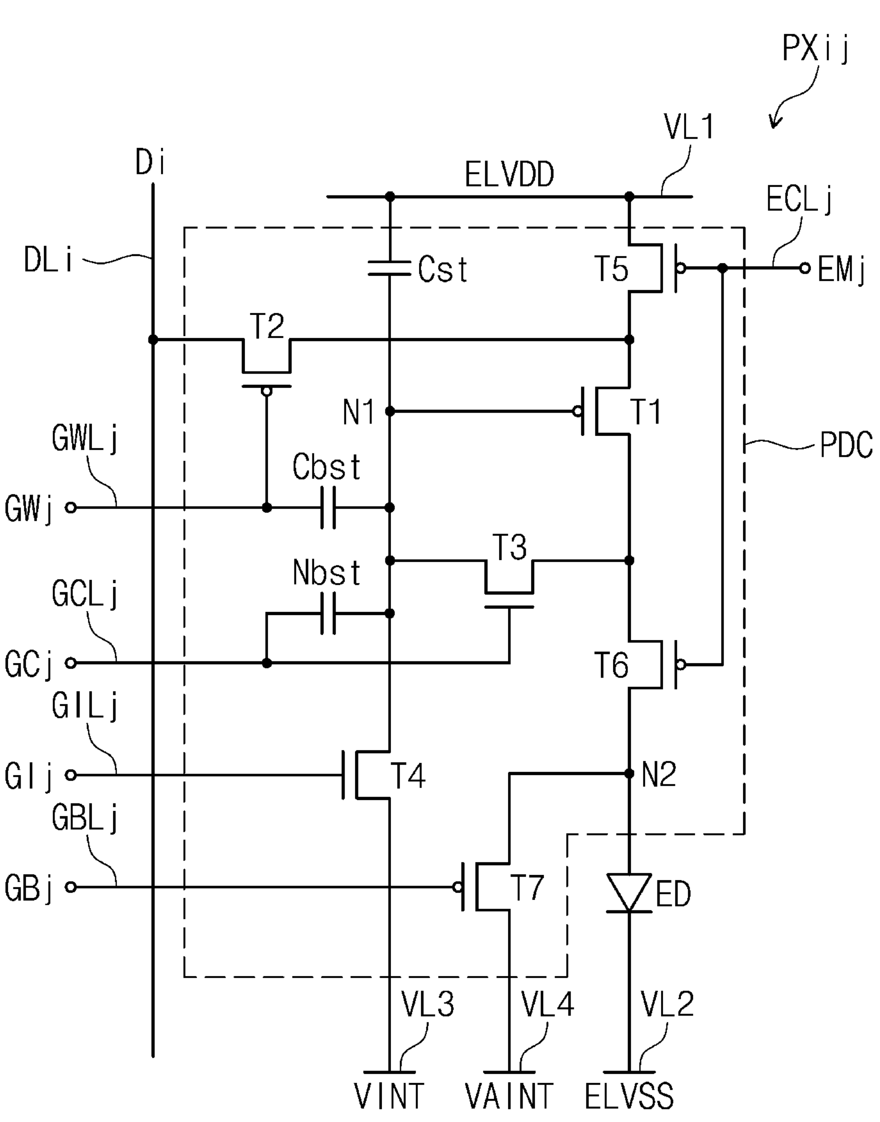
FIG. 3B is an equivalent circuit diagram of an embodiment of a pixel according to the inventive concept.

FIG. 3B is an equivalent circuit diagram of an embodiment of a pixel according to the inventive concept.

FIG. 3B illustrates an equivalent circuit diagram of a pixel PXij among the plurality of pixels PX (refer to FIG. 3A). Here, i is an integer of 1 ton, and j is an integer of 1 to m. Since each of the plurality of pixels PX has the same circuit structure, the description of the circuit structure for the pixel PXij applies equally to the other pixels PX, and thus detailed description of the other pixels PX will be omitted.

Referring to FIGS. 3A and 3B, the pixel PXij is connected to an i-th data line DLi among data lines DL1 to DLn, a j-th initialization scan line GILj among initialization scan lines GIL1 to GILm, a j-th compensation scan line GCLj among compensation scan lines GCL1 to GCLm, a j-th write scan line GWLj among write scan lines GWL1 to GWLm, a j-th black scan line GBLj among black scan lines GBL1 to GBLm, a j-th emission control line ECLj among emission control lines ECL1 to ECLm, first and second drive voltage lines VL1 and VL2, and first and second initialization voltage lines VL3 and VL4.

The pixel PXij includes a light-emitting element ED and a pixel circuit PDC. The light-emitting element ED may be a light-emitting diode. In an embodiment of the inventive concept, the light-emitting element ED may be an organic light-emitting diode including an organic light-emitting layer, but is not particularly limited thereto. The pixel circuit PDC may control the amount of current flowing through the light-emitting element ED in response to a data signal Di. The light-emitting element ED may emit light with a predetermined brightness in correspondence to the amount of the current provided from the pixel circuit PDC.

The pixel circuit PDC may include first to seventh transistors T1, T2, T3, T4, T5, T6, and T7, and first to third capacitors Cst, Cbst, and Nbst. In an embodiment of the inventive concept, the configuration of the pixel circuit PDC is not limited to the embodiment illustrated in FIG. 3B. The pixel circuit PDC illustrated in FIG. 3B is only an example, and the configuration of the pixel circuit PDC may be provided differently.

At least one of the first to seventh transistors T1, T2, T3, T4, T5, T6, and T7 may have a low-temperature polycrystalline silicon ("LTPS") semiconductor layer. At least one of the first to seventh transistors T1, T2, T3, T4, T5, T6, and T7 may have an oxide semiconductor layer. In an embodiment, the third and fourth transistors T3 and T4 may be oxide semiconductor transistors, and the first, second, fifth, sixth, and seventh transistors T1, T2, T5, T6, and T7 may be LTPS transistors, for example.

In particular, the first transistor T1 which directly affects the brightness of the light-emitting element ED may include a semiconductor layer composed of highly-reliable polycrystalline silicon, thereby providing a high-resolution display device. An oxide semiconductor has relatively high carrier mobility and a relatively low leakage current, and thus voltage drop is not significant despite the long driving time. That is, the color change on an image due to the voltage drop is not significant even during a relatively low frequency drive, and therefore, the relatively low frequency drive is possible. Since the oxide semiconductor has such an advantage of having relatively low leakage current, by employing an oxide semiconductor for at least one of the third transistor T3 or the fourth transistor T4 connected to a gate electrode of the first transistor T1, it may be possible to prevent the leakage current from flowing into the gate electrode, and to reduce power consumption at the same time.

Some of the first to seventh transistors T1, T2, T3, T4, T5, T6, and T7 may be P-type transistors, and others may be N-type transistors. In an embodiment, the first, second, fifth, sixth, and seventh transistors T1, T2, T5, T6, and T7 may be P-type transistors, and the third and fourth transistors T3 and T4 may be N-type transistors, for example.

The configuration of the pixel circuit PDC in an embodiment of the inventive concept is not limited to the embodiment illustrated in FIG. 3B. The pixel circuit PDC illustrated in FIG. 3B is only an example, and the configuration of the pixel circuit PDC may be provided differently. In an embodiment, all of the first to seventh transistors T1, T2, T3, T4, T5, T6, and T7 may be either P-type transistors or N-type transistors, for example. In an alternative embodiment, the first, second, fifth, and sixth transistors T1, T2, T5, and T6 may be P-type transistors, and the third, fourth, and seventh transistors T3, T4, and T7 may be N-type transistors.

The j-th initialization scan line GILj, the j-th compensation scan line GCLj, the j-th write scan line GWLj, the j-th black scan line GBLj, and the j-th emission control line ECLj may respectively transmit a j-th initialization scan signal GIj, a j-th compensation scan signal GCj, a j-th write scan signal GWj, a j-th black scan signal GBj, and a j-th emission control signal EMj to the pixel PXij. The i-th data line DLi transmits an i-th data signal Di to the pixel PXij. The i-th data signal Di may have a level of voltage corresponding to an image signal input to the display device DD (refer to FIG. 1A).

The first and second drive voltage lines VL1 and VL2 may transmit a first drive voltage ELVDD and a second drive voltage ELVSS to the pixel PXij, respectively. In addition, the first and second initialization voltage lines VL3 and VL4 may transmit a first initialization voltage VINT and a second initialization voltage VAINT to the pixel PXij, respectively.

The first transistor T1 is connected between the first drive voltage line VL1 which receives the first drive voltage ELVDD and the light-emitting element ED. The first transistor T1 includes a first electrode connected to the first drive voltage line VL1 via the fifth transistor T5, a second electrode connected to a pixel electrode (or referred to as an anode) of the light-emitting element ED via the sixth transistor T6, and a third electrode (e.g., a gate electrode) connected to one end of the first capacitor Cst (e.g., a first node N1). The first transistor T1 may receive the i-th data signal Di which is transmitted through the i-th data line DLi according to a switching operation of the second transistor T2, and may supply a drive current to the light-emitting element ED.

The second transistor T2 is connected between the data line DLi and the first electrode of the first transistor T1. The second transistor T2 includes a first electrode connected to the data line DLi, a second electrode connected to the first electrode of the first transistor T1, and a third electrode (e.g., a gate electrode) connected to the j-th write scan line GWLj. The second transistor T2 may be turned on in response to the write scan signal GWj transmitted through the j-th write scan line GWLj, and may transmit the i-th data signal Di transmitted through the i-th data line DLi to the first electrode of the first transistor T1. One end of the second capacitor Cbst may be connected to the third electrode of the second transistor T2, and the other end of the second capacitor Cbst may be connected to the first node N1.

The third transistor T3 is connected between the second electrode of the first transistor T1 and the first node N1. The third transistor T3 includes a first electrode connected to the third electrode of the first transistor T1, a second electrode connected to the second electrode of the first transistor T1, and a third electrode (e.g., a gate electrode) connected to the j-th compensation scan line GCLj. The third transistor T3 may be turned on in response to the j-th compensation scan signal GCj transmitted through the j-th compensation scan line GCLj, and may connect the third electrode of the first transistor T1 and the second electrode of the first transistor T1 together for the first transistor T1 to be diode-connected. One end of the third capacitor Nbst may be connected to the third electrode of the third transistor T3, and the other end of the third capacitor Nbst may be connected to the first node N1.

The fourth transistor T4 is connected between the first initialization voltage line VL3 to which the first initialization voltage VINT is applied and the first node N1. The fourth transistor T4 includes a first electrode connected to the first initialization voltage line VL3 through which the first initialization voltage VINT is transmitted, a second electrode connected to the first node N1, and a third electrode (e.g., a gate electrode) connected to the j-th initialization scan line GILj. The fourth transistor T4 is turned on in response to the j-th initialization scan signal GIj transmitted through the j-th initialization scan line GILj. The turned-on fourth transistor T4 initializes the potential of the third electrode of the first transistor T1 (that is, the potential of the first node N1) by transmitting the first initialization voltage VINT to the first node N1.

The fifth transistor T5 includes a first electrode connected to the first drive voltage line VL1, a second electrode connected to the first electrode of the first transistor T1, and a third electrode (e.g., a gate electrode) connected to the j-th emission control line ECLj. The sixth transistor T6 includes a first electrode connected to the second electrode of the first transistor T1, a second electrode connected to the pixel electrode (i.e., second node N2) of the light-emitting element ED, and a third electrode (e.g., a gate electrode) connected to the j-th emission control line ECLj.

The fifth and sixth transistors T5 and T6 are simultaneously turned on in response to the j-th emission control signal EMj transmitted through the j-th emission control line ECLj. The first drive voltage ELVDD applied through the turned-on fifth transistor T5 may be compensated through the diode-connected first transistor T1, and then may be transmitted to the light-emitting element ED through the sixth transistor T6.

The seventh transistor T7 includes a first electrode connected to the second initialization voltage line VL4 through which the second initialization voltage VAINT is transmitted, a second electrode connected to the second electrode of the sixth transistor T6, and a third electrode (e.g., a gate electrode) connected to the black scan line GBLj. The second initialization voltage VAINT may have a level of voltage lower than or equal to that of the first initialization voltage VINT.

One end of the first capacitor Cst is connected to the third electrode of the first transistor T1, and the other end of the first capacitor Cst is connected to the first drive voltage line VL1. A cathode of the light-emitting element ED may be connected to the second drive voltage line VL2 through which the second drive voltage ELVSS is transmitted. The second drive voltage ELVSS may have a lower level of voltage than the first drive voltage ELVDD.

Figure 4:
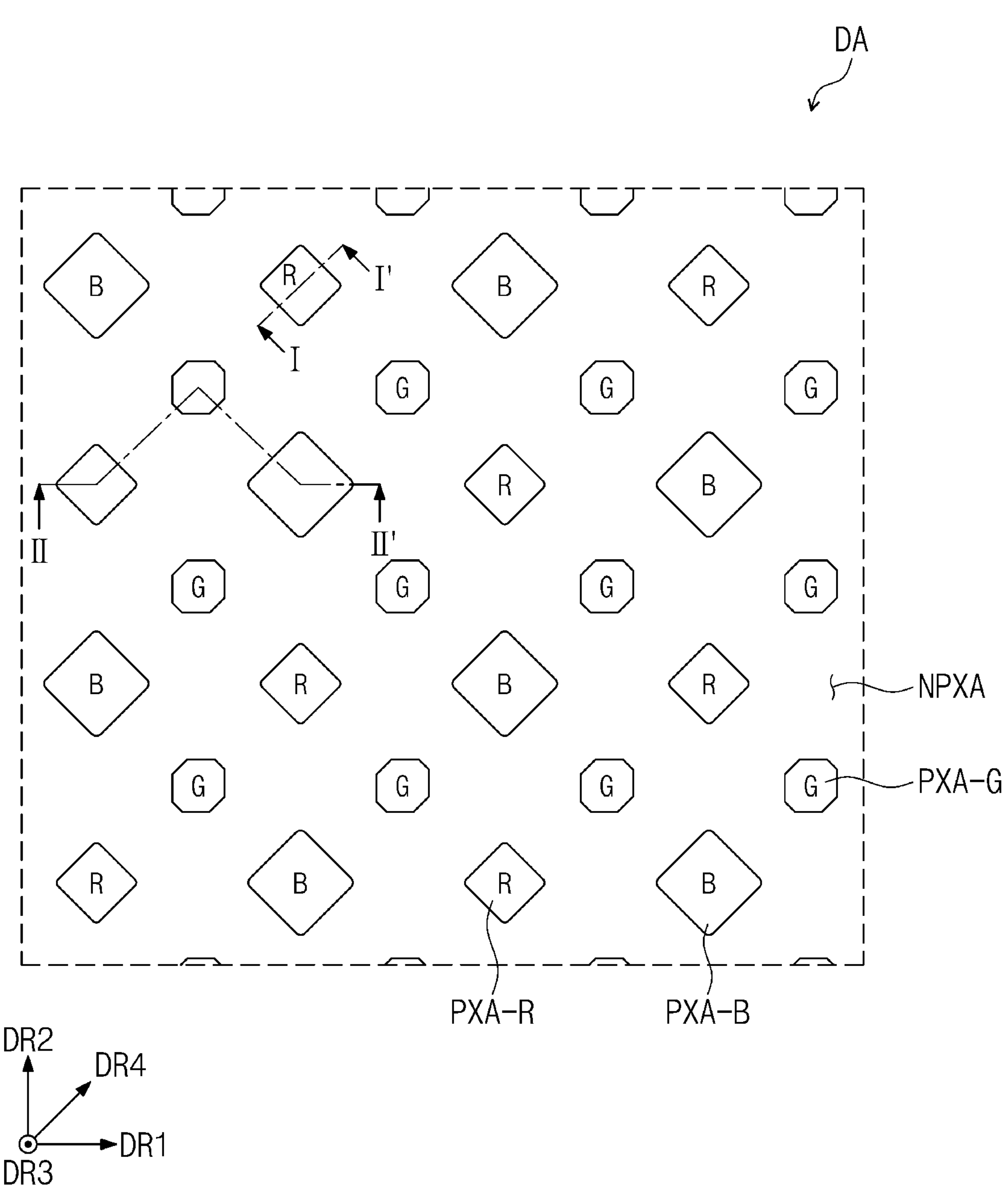
FIG. 4 is an enlarged plan view illustrating an embodiment of a portion of a display region of a display panel according to the inventive concept.

FIG. 4 is an enlarged plan view illustrating an embodiment of a portion of a display region of a display panel according to the inventive concept. FIG. 4 illustrates a plan view of a display module DM that is viewed on the display surface IS (refer to FIG. 1B) of the display module DM (refer to FIG. 1B), and illustrates the arrangements of light-emitting regions PXA-R, PXA-G, and PXA-B.

Referring to FIG. 4, a display region DA may include first to third light-emitting regions PXA-R, PXA-G, and PXA-B and a peripheral region NPXA surrounding the first to third light-emitting regions PXA-R, PXA-G, and PXA-B. The first to third light-emitting regions PXA-R, PXA-G, and PXA-B may respectively correspond to regions where light provided from light-emitting elements ED1, ED2, and ED3 (refer to FIG. 6) is emitted. The first to third light-emitting regions PXA-R, PXA-G, and PXA-B may be distinguished by the color of light emitted to the outside of the display module DM (refer to FIG. 2).

The first to third light-emitting regions PXA-R, PXA-G, and PXA-B may respectively provide first to third color light having different colors. In an embodiment, the first color light may be red light, the second color light may be green light, and the third color light may be blue light, for example. However, the embodiment of the first to third color light is not necessarily limited thereto.

The first to third light-emitting regions PXA-R, PXA-G, and PXA-B may each be defined as a region where an upper surface of an anode is exposed by a light-emitting opening to be described later. The peripheral region NPXA may set boundaries of the first to third light-emitting regions PXA-R, PXA-G, and PXA-B, and prevent color mixing between the first to third light-emitting regions PXA-R, PXA-G, and PXA-B.

The first to third light-emitting regions PXA-R, PXA-G, and PXA-B may each be provided in plural, and may each be repeatably disposed in a predetermined form of arrangement in the display region DA. In an embodiment, the first and third light-emitting regions PXA-R and PXA-B may be alternately arranged along a first direction DR1 to form a 'first group', for example. The second light-emitting regions PXA-G may be arranged along the first direction DR1 to form a 'second group'. The 'first group' and the 'second group' may each be provided in plural, and the 'first groups' and the 'second groups' may be alternately arranged along a second direction DR2.

One second light-emitting region PXA-G may be disposed apart from one first light-emitting region PXA-R or one third light-emitting region PXA-B in a fourth direction DR4. The fourth direction DR4 may be defined as a direction between the first direction DR1 and the second direction DR2.

FIG. 4 illustrates the form of arrangements of the first to third light-emitting regions PXA-R, PXA-G, and PXA-B. However, the inventive concept is not limited thereto, and the first to third light-emitting regions PXA-R, PXA-G, and PXA-B may be arranged in various forms. In an embodiment, the first to third light-emitting regions PXA-R, PXA-G, and PXA-B may have a PENTILE™ arrangement as illustrated in FIG. 4. In an alternative embodiment, the first to third light-emitting regions PXA-R, PXA-G, and PXA-B may have a stripe form of arrangement, or a Diamond Pixel™ arrangement.

Figure 5:
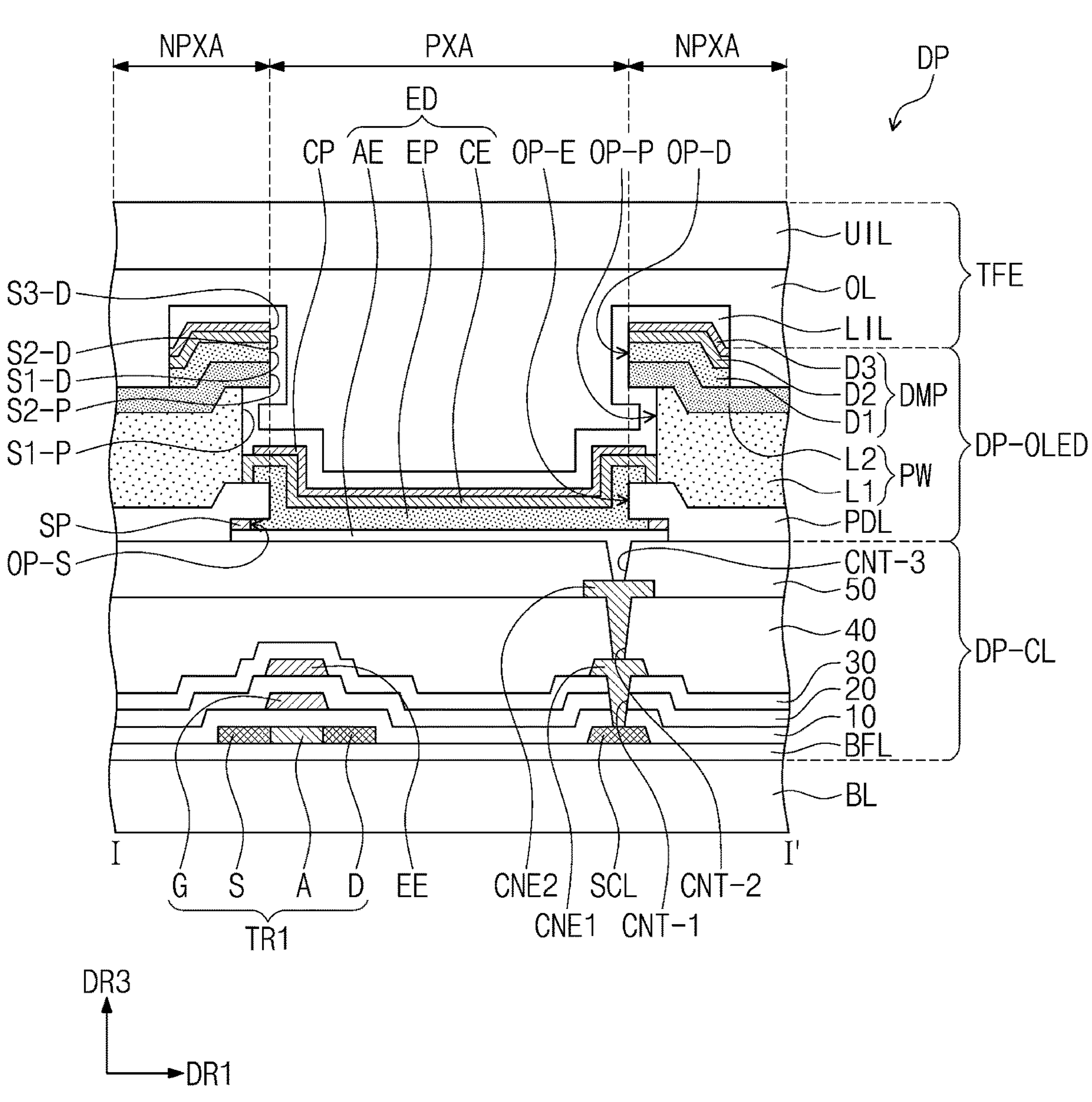
FIG. 5 is a cross-sectional view of an embodiment of a display panel according to the inventive concept.

The first to third light-emitting regions PXA-R, PXA-G, and PXA-B may have various shapes in a plan view. In an embodiment, the first to third light-emitting regions PXA-R, PXA-G, and PXA-B may have a shape of a polygon, circle, oval, or the like, for example. FIG. 5 illustrates that the first and third light-emitting regions PXA-R and PXA-B have a quadrilateral shape (or a diamond shape), and the second light-emitting region PXA-G has an octagonal shape in a plan view.

The first to third light-emitting regions PXA-R, PXA-G, and PXA-B may have the same shape in a plan view, or at least some may have different shapes. FIG. 4 illustrates the first and third light-emitting regions PXA-R and PXA-B having the same shape, and the second light-emitting region PXA-G having a different shape from the shapes of the first and third light-emitting regions PXA-R and PXA-B in a plan view.

At least some of the first to third light-emitting regions PXA-R, PXA-G, and PXA-B may have different areas in a plan view. In an embodiment, the area of the first light-emitting region PXA-R that emits red light may be larger than the area of the second light-emitting region PXA-G that emits green light, and may be smaller than the area of the third light-emitting region PXA-B that emits blue light. However, the relationship between the first to third light-emitting regions PXA-R, PXA-G, and PXA-B in the areas according to the color of light emitted is not limited thereto, and may vary according to the design of the display module DM (refer to FIG. 2). In addition, the inventive concept is not limited thereto, and the first to third light-emitting regions PXA-R, PXA-G, and PXA-B may have the same area in a plan view.

The shape, area, arrangement, etc. of the first to third light-emitting regions PXA-R, PXA-G, and PXA-B of the display module DM (refer to FIG. 2) in an embodiment of the inventive concept may be variously designed according to the color of light emitted, the size of the display module DM (refer to FIG. 2), and the composition thereof, and are not limited to the embodiment illustrated in FIG. 4.

FIG. 5 is a cross-sectional view of an embodiment of a display panel according to the inventive concept. FIG. 5 illustrates a cross-section taken along line I-I' of FIG. 4. FIG. 5 will be described with reference to FIG. 2, and descriptions of the components with the same reference numerals or symbols will be omitted.

FIG. 5 illustrates an enlarged view of a light-emitting region PXA in the display region DA (refer to FIG. 4), and the light-emitting region PXA in FIG. 5 may correspond to any one among the first to third light-emitting regions PXA-R, PXA-G, and PXA-B in FIG. 4.

Referring to FIG. 5, the display panel DP may include a base layer BL, a circuit element layer DP-CL, a display element layer DP-OLED, and a thin-film encapsulation layer TFE.

The display panel DP may include a plurality of insulation layers, and a semiconductor pattern, a conductive pattern, a signal line, etc. The insulation layer, a semiconductor layer, and a conductive layer are formed through coating, deposition, etc. After this, the insulation layer, the semiconductor layer, and the conductive layer may be selectively patterned through photolithography and etching. In this way, the semiconductor pattern, the conductive pattern, the signal line, etc. included in the circuit element layer DP-CL and the display element layer DP-OLED may be formed.

The circuit element layer DP-CL may be disposed on the base layer BL. The circuit element layer DP-CL may include a buffer layer BFL, a transistor TRI, a signal transmission region SCL, first to fifth insulation layers 10, 20, 30, 40, and 50, an upper electrode EE, and a plurality of connection electrodes CNE1 and CNE2.

The buffer layer BFL may be disposed on the base layer BL. The buffer layer BFL may improve bonding force between the base layer BL and the semiconductor pattern. The buffer layer BFL may include a silicon oxide layer and a silicon nitride layer. The silicon oxide layer and the silicon nitride layer may be alternately stacked.

The semiconductor pattern may be disposed on the buffer layer BFL. The semiconductor pattern may include polysilicon. However, the inventive concept is not limited thereto, and the semiconductor pattern may include amorphous silicon or metal oxide. FIG. 5 only illustrates a partial semiconductor pattern in an embodiment, and the semiconductor pattern may further be disposed in the plurality of light-emitting regions PXA-R, PXA-G, and PXA-B (refer to FIG. 4). The semiconductor pattern may be arranged in a particular rule across the plurality of light-emitting regions PXA-R, PXA-G, and PXA-B. The semiconductor pattern may have different electrical characteristics depending on whether it is doped or not. The semiconductor pattern may include a first region with relatively high doping concentration, and a second region with relatively low doping concentration. The first region may be doped with an N-type dopant or a P-type dopant. A P-type transistor may include the first region doped with a P-type dopant.

The first region has higher conductivity than the second region, and substantially serves as an electrode or a signal line. The second region may substantially correspond to an active (or channel) of a transistor. In other words, a portion of the semiconductor pattern may be an active of a transistor, and another portion may be a source or drain of the transistor, and another portion may be a conductive region.

The source S, the active A, and the drain D of the transistor TRI may be formed from the semiconductor pattern. FIG. 5 illustrates a portion of the signal transmission region SCL formed from the semiconductor pattern. Although not separately illustrated in the drawing, the signal transmission region SCL may be connected to the drain D of the transistor TRI in a plan view.

The first to fifth insulation layers 10, 20, 30, 40, and 50 may be disposed on the buffer layer BFL. The first to fifth insulation layers 10, 20, 30, 40, and 50 may be inorganic layers or organic layers.

The first insulation layer 10 may be disposed on the buffer layer BFL. The first insulation layer 10 may cover the source S, the active A, and the drain D of the transistor TRI, and the signal transmission region SCL which are disposed on the buffer layer BFL. A gate G of the transistor TRI may be disposed on the first insulation layer 10. The second insulation layer 20 may be disposed on the first insulation layer 10, and cover the gate G. The upper electrode EE may be disposed on the second insulation layer 20. The third insulation layer 30 may be disposed on the second insulation layer 20, and cover the upper electrode EE.

The first connection electrode CNE1 may be disposed on the third insulation layer 30. The first connection electrode CNE1 may be connected to the signal transmission region SCL through a contact hole CNT-1 passing through the first to third insulation layers 10, 20, and 30. The fourth insulation layer 40 may be disposed on the third insulation layer 30, and cover the first connection electrode CNE1. The fourth insulation layer 40 may be an organic layer.

The second connection electrode CNE2 may be disposed on the fourth insulation layer 40. The second connection electrode CNE2 may be connected to the first connection electrode CNE1 through a contact hole CNT-2 passing through the fourth insulation layer 40. The fifth insulation layer 50 may be disposed on the fourth insulation layer 40, and cover the second connection electrode CNE2. The fifth insulation layer 50 may be an organic layer.

The display element layer DP-OLED may be disposed on the circuit element layer DP-CL. The display element layer DP-OLED may include a light-emitting element ED, a sacrificial pattern SP, a pixel-defining film PDL, a partition wall PW, and dummy patterns DMP.

The light-emitting element ED may include an anode AE (or a first electrode), a light-emitting pattern EP, and a cathode CE (or a second electrode). First to third light-emitting elements ED1, ED2, and ED3 to be described later may each include substantially the same components as the light-emitting element ED in FIG. 5. Descriptions of the anode AE, the light-emitting pattern EP, and the cathode CE may equally apply to an anode, a light-emitting pattern, and a cathode of each of the first to third light-emitting elements to be described later.

The anode AE may be disposed on the fifth insulation layer 50 of the circuit element layer DP-CL. The anode AE may be a transmissive electrode, a semi-transparent electrode, or a reflective electrode. The anode AE may be connected to the second connection electrode CNE2 by a connection contact hole CNT-3 defined by passing through the fifth insulation layer 50. Therefore, the anode AE may be electrically connected to the signal transmission region SCL through the first and second connection electrodes CNE1 and CNE2, and electrically connected to the corresponding circuit element. The anode AE may include a single-layer or multi-layer structure. The anode AE may include a plurality of layers including or consisting of indium tin oxide ("ITO") and Ag. In an embodiment, the anode AE may include a layer including or consisting of ITO (hereinafter, a lower ITO layer), a layer including or consisting of Ag disposed on the lower ITO layer (hereinafter, a Ag layer), and a layer including or consisting of ITO disposed on the Ag layer (hereinafter, an upper ITO layer), for example.

The sacrificial pattern SP may be disposed between the anode AE and the pixel-defining film PDL. The sacrificial pattern SP may correspond to a portion of a layer provided to prevent the anode AE from being damaged during a process of forming a partition wall opening OP-P, etc. to be described later. A sacrificial opening OP-S that exposes a portion of an upper surface of the anode AE may be defined in the sacrificial pattern SP. The sacrificial opening OP-S may overlap a light-emitting opening OP-E to be described later. The sacrificial pattern SP may include amorphous transparent conductive oxide. In an embodiment, the sacrificial pattern SP may be aluminum (Al)-doped zinc oxide ($ZnO_x$), for example.

The pixel-defining film PDL may be disposed on the fifth insulation layer 50 of the circuit element layer DP-CL. The light-emitting opening OP-E may be defined in the pixel-defining film PDL. The light-emitting opening OP-E may correspond to the anode AE, and the pixel-defining film PDL may expose at least a portion of the anode AE through the light-emitting opening OP-E.

In addition, the light-emitting opening OP-E may correspond to the sacrificial opening OP-S of the sacrificial pattern SP. According to this embodiment, the upper surface of the anode AE may be spaced apart from the pixel-defining film PDL with the sacrificial pattern SP therebetween in a cross-section. Accordingly, the anode AE may be prevented from being damaged during a process of forming the light-emitting opening OP-E.

On a plane, the area of the light-emitting opening OP-E may be smaller than the area of the sacrificial opening OP-S. That is, an inner side surface of the pixel-defining film PDL that defines the light-emitting opening OP-E may be closer to the center of the anode AE than an inner side surface of the sacrificial pattern SP that defines the sacrificial opening OP-S is to the center of the anode AE. However, the inventive concept is not limited thereto, and the inner side surface of the sacrificial pattern SP that defines the sacrificial opening OP-S may also be substantially aligned with the inner side surface of the pixel-defining film PDL that defines the corresponding light-emitting opening OP-E. At this time, the light-emitting region PXA may also be seen as a region of the anode AE exposed from the corresponding sacrificial opening OP-S.

The pixel-defining film PDL may include an inorganic insulating material. The pixel-defining film PDL may include at least one of silicon oxide $SiO_x$, silicon nitride $SiN_x$, or silicon oxynitride $SiO_xN_y$. In an embodiment, the pixel-defining film PDL may include silicon nitride $SiN_x$, for example. The pixel-defining film PDL may be disposed between the anode AE and the partition wall PW, and may thus block the anode AE and the partition wall PW from being electrically connected to each other.

The partition wall PW may be disposed on the pixel-defining film PDL. A partition wall opening OP-P may be defined in the partition wall PW. The partition wall opening OP-P may correspond to the light-emitting opening OP-E, and expose at least a portion of the anode AE.

The partition wall PW may have an undercut shape in a cross-section. The partition wall PW may include multiple layers stacked in sequence, and at least one layer of the multiple layers may be recessed compared to the other layers. At least one layer of the multiple layers included in the partition wall PW may protrude compared to the other layers. Accordingly, the partition wall PW may include a tip portion.

The partition wall PW may include a first partition wall layer L1 and a second partition wall layer L2. The first partition wall layer L1 may be relatively recessed compared to the second partition wall layer L2 with respect to the light-emitting region PXA. That is, the first partition wall layer L1 may be formed by undercutting with respect to the second partition wall layer L2.

Figure 8A:
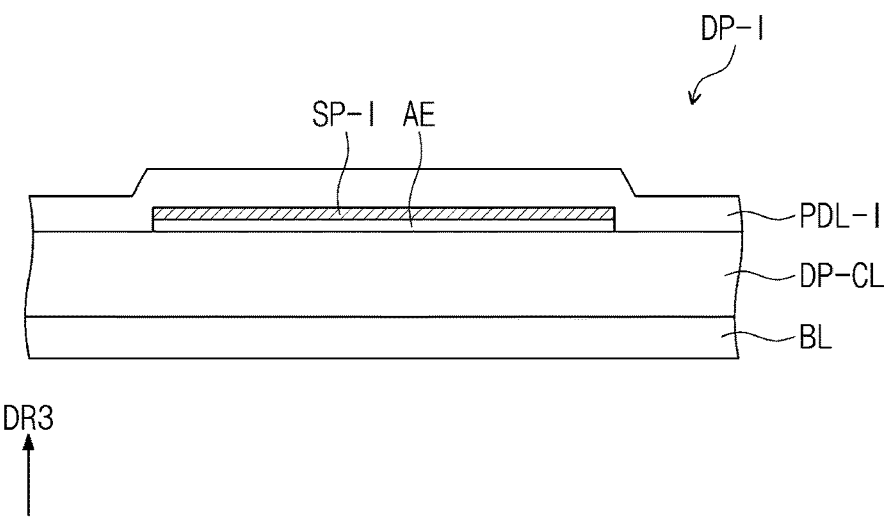
FIGS. 8A to 8N are cross-sectional views illustrating an embodiment of a partial operation of a manufacturing method for a display panel according to the inventive concept.
Figure 8B:
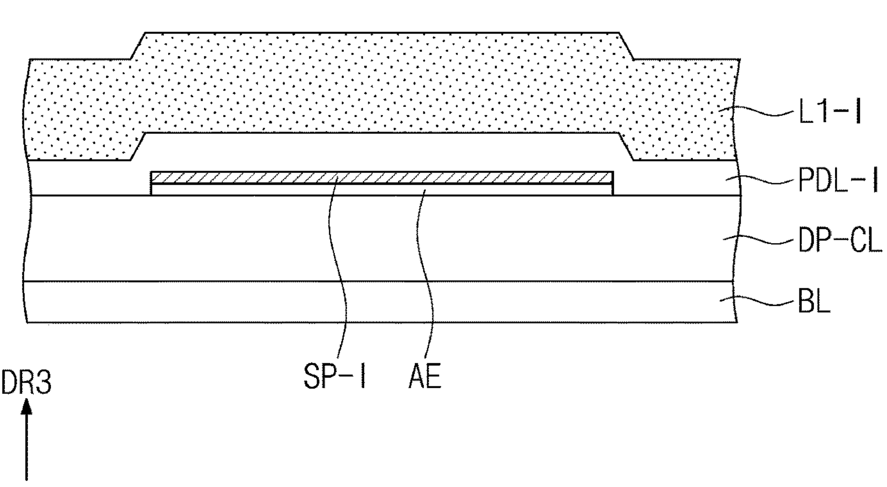
Figure 8C:
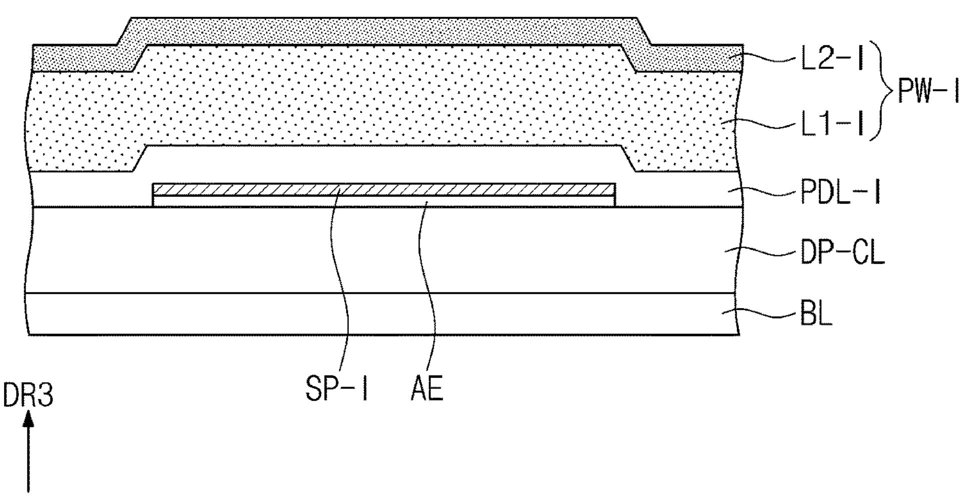
Figure 8D:
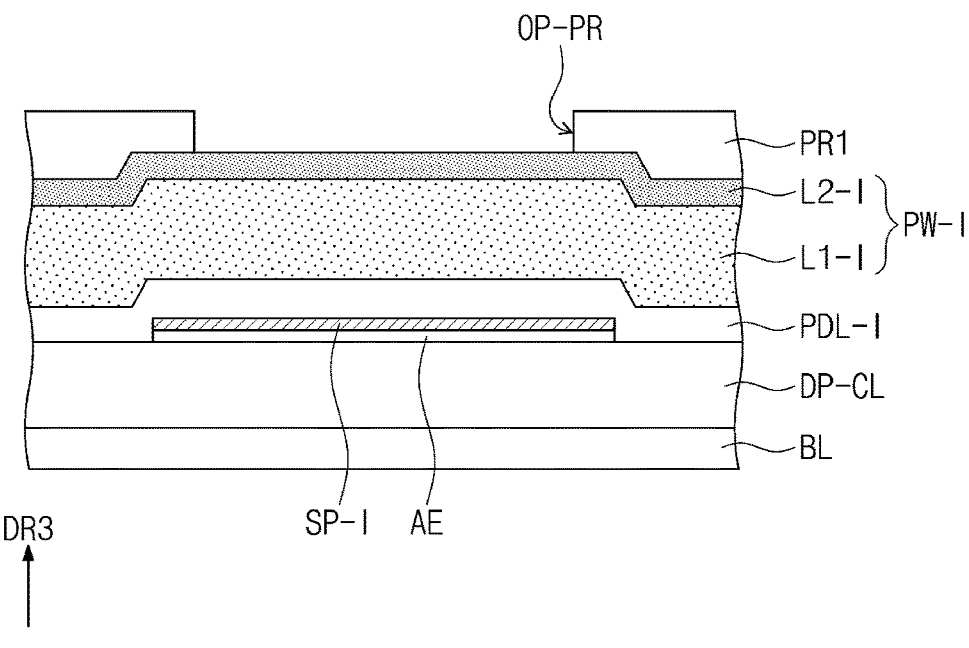
Figure 8E:
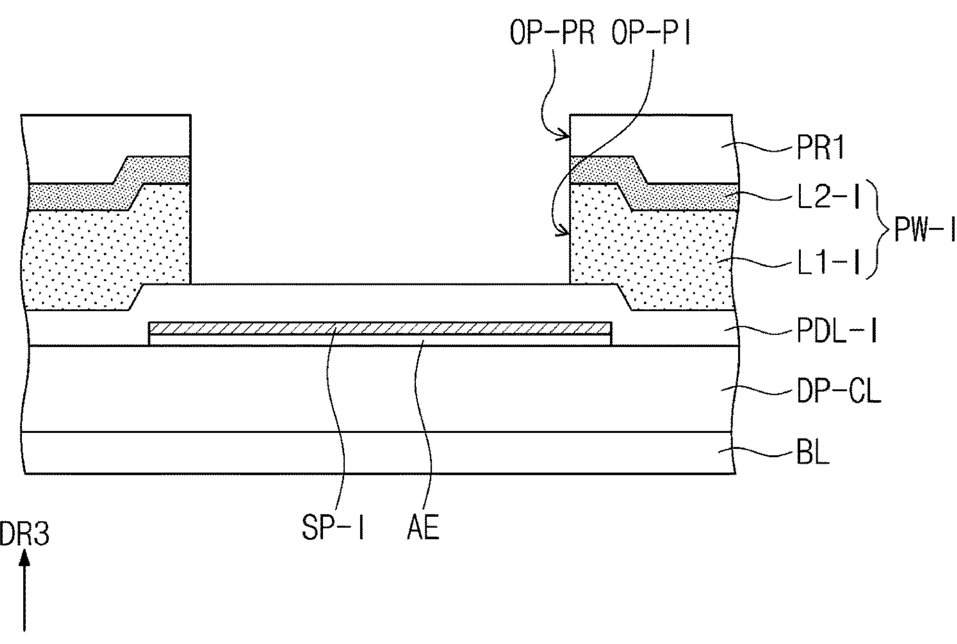
Figure 8F:
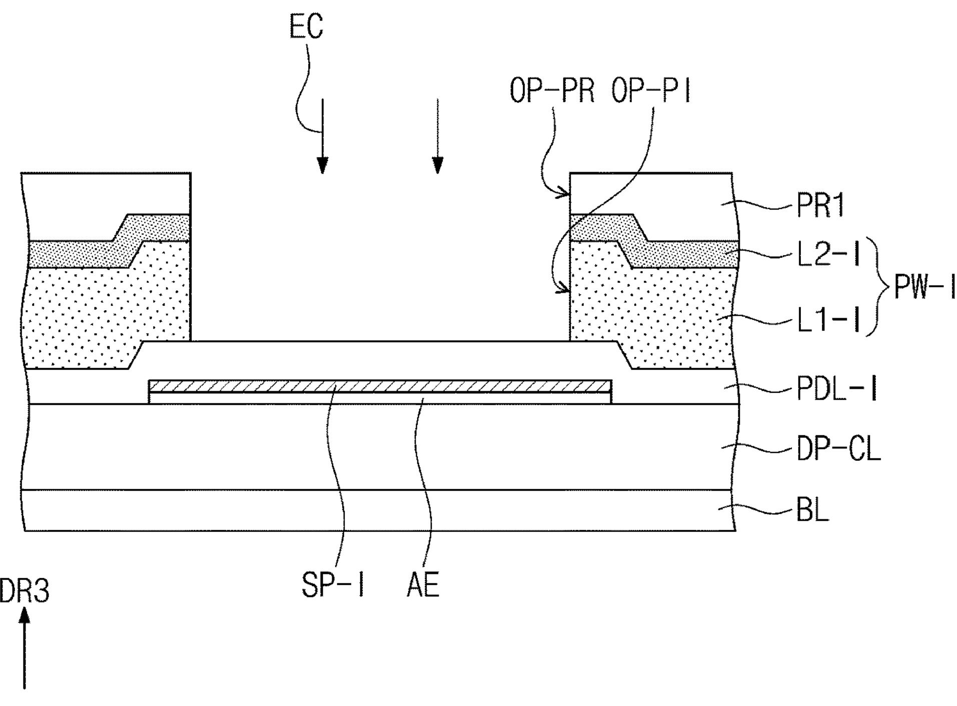
Figure 8G:
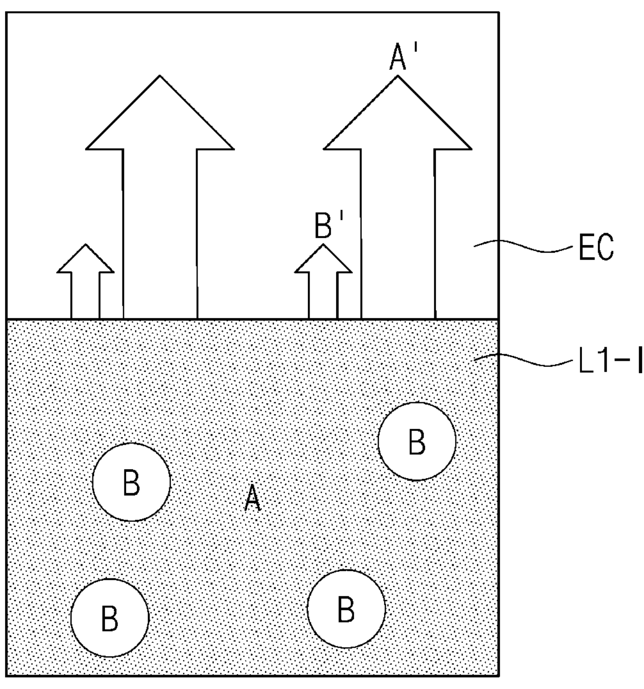
Figure 8H:
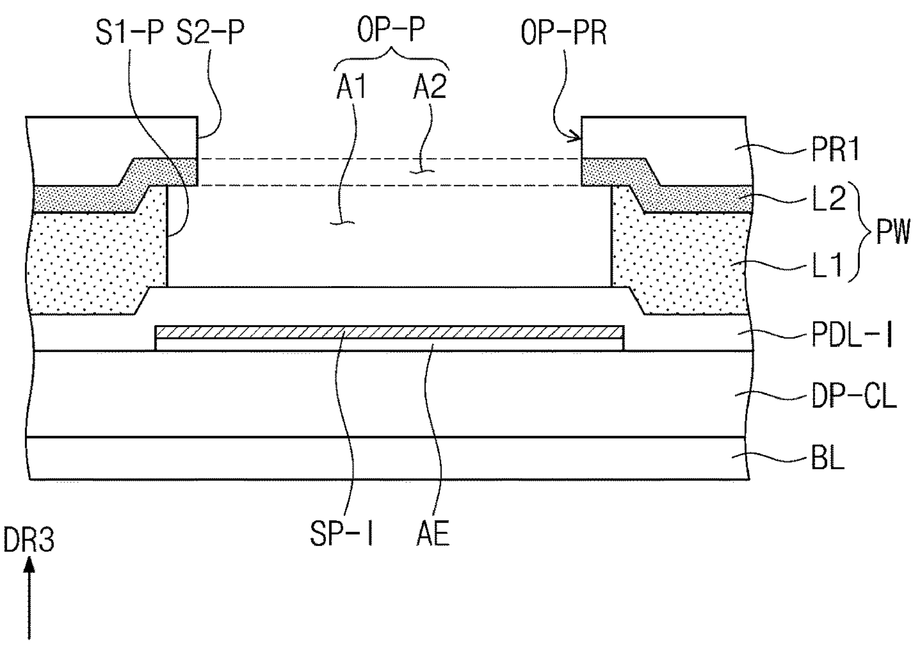

The partition wall opening OP-P defined in the partition wall PW may include a first region A1 (refer to FIG. 8H) and a second region A2 (refer to FIG. 8H). The first partition wall layer L1 may include a first inner side surface S1-P defining a portion of the first region A1 (refer to FIG. 8H) of the partition wall opening OP-P, and the second partition wall layer L2 may include a second inner side surface S2-P defining the second region A2 (refer to FIG. 8H).

The first inner side surface S1-P of the first partition wall layer L1 may be recessed relatively further inward than the second inner side surface S2-P of the second partition wall layer L2. That is, the first inner side surface S1-P may be formed by undercutting with respect to the second inner side surface S2-P. The second partition wall layer L2 protruding toward the light-emitting region PXA may define the tip portion.

The width of the first region A1 (refer to FIG. 8H) may be different from the width of the second region A2 (refer to FIG. 8H). The width of the first region A1 (refer to FIG. 8H) may be larger than the width of the second region A2 (refer to FIG. 8H). In this case, the second region A2 (refer to FIG. 8H) of the partition wall opening OP-P may be a region that defines the tip portion.

The second inner side surface S2-P of the second partition wall layer L2 defining the second region A2 (refer to FIG. 8H) may protrude compared to the first inner side surface S1-P of the first partition wall layer L1 defining the first region A1 (refer to FIG. 8H), and may thus be adjacent to the center of the anode AE. That is, the second inner side surface S2-P may be disposed closer to the center of the anode AE than the first inner side surface S1-P is to the center of the anode AE in a direction, e.g., a fourth direction DR4.

The partition wall PW may include the first partition wall layer L1 disposed on the pixel-defining film PDL and the second partition wall layer L2 disposed on the first partition wall layer L1. The second partition wall layer L2 may be provided to be etched at a first etch rate, and the first partition wall layer L1 may be provided to be etched at a second etch rate that is greater than the first etch rate. In this specification, the first and second etch rates may each refer to the etch rate for an alkaline chemical solution in an undercut etching process to be described later. In the undercut etching process, the inner side surface of the first partition wall layer L1 may be more etched than the inner side surface of the second partition wall layer L2 due to the etch rate of the first partition wall layer L1 greater than that of the second partition wall layer L2. In an alternative embodiment, in the undercut etching process, the second partition wall layer L2 may not be etched or may not be substantially etched.

In an embodiment, the etch rate of the first partition wall layer L1 may be about 25 nanometers per minute (nm/min) to about 100 nm/min. That is, the etch rate of the first partition wall layer L1 for the alkaline chemical solution may be about 25 nm/min to about 100 nm/min. In this specification, the "etch rate" may refer to the amount of etching per minute in a film thickness direction. The unit of the etch rate may be expressed in nm/min. The etch rate of the first partition wall layer L1 may be achieved by controlling the contents of metals included in the first partition wall layer L1. This will be described later.

Referring to FIG. 5 again, the first partition wall layer L1 included in the partition wall PW may be disposed on the pixel-defining film PDL. The first partition wall layer L1 may be directly disposed on the pixel-defining film PDL.

The first partition wall layer L1 includes a conductive material. The first partition wall layer L1 may include relatively low resistance metal. The first partition wall layer L1 may include first metal, aluminum (Al), and nickel (Ni). The first partition wall layer L1 may include an aluminum-nickel-first metal alloy. The aluminum-nickel-first metal alloy may be an aluminum-based alloy doped with nickel and the first metal.

The first partition wall layer L1 includes aluminum and nickel. Nickel may be included in a metal film including or consisting of aluminum, and may contribute to improving etch selectivity, chemical resistance, electrical conductivity, etc. When nickel is applied to the aluminum-including or consisting of metal film, due to the standard reduction potential of nickel higher than that of aluminum, ionization of aluminum may be induced, so that the etching speed may be promoted. In addition, the metal film including or consisting of aluminum and nickel may have excellent electrical conductivity and excellent interfacial characteristics, and thus when the metal film is applied to the first partition wall layer L1, the electrical reliability between the first partition wall layer L1 and the cathode CE may be improved.

The first partition wall layer L1 may include the first metal. The first metal may have a higher standard reduction potential than that of nickel. The first metal may have a standard reduction potential higher than that of nickel by about 0.1 volt (V) or more. The first metal is not limited as long as the metal having a higher standard reduction potential than that of nickel, but may include copper (Cu), germanium (Ge), tin (Sn), gold (Au), molybdenum (Mo), or silver (Ag) as examples. The first metal may serve to promote the etching speed of aluminum in an etching process of the metal film including or consisting of aluminum and nickel. Since the first metal has a higher standard reduction potential than nickel, the first metal may further promote the ionization of aluminum in the etching process of the metal film including or consisting of aluminum and nickel, and accordingly, the etching speed may be increased. As the first partition wall layer L1 includes the first metal having a higher standard reduction potential than nickel, the selective etching speed of aluminum of the metal film including or consisting of aluminum and nickel may become increased, thereby improving the process reliability.

The first metal and nickel may be higher than aluminum in standard reduction potential. When a metal including or consisting of metals having different levels of standard reduction potential is exposed to an etching solution, the metal having a relatively low standard reduction potential, among the two metals, may be higher in ionization tendency than the metal having a relatively high standard reduction potential. In an embodiment, when the metal film including or consisting of aluminum, nickel, and the first metal is exposed to an etching solution, aluminum is relatively high in ionization tendency, compared to nickel and the first metal, for example, so that the etching of aluminum may be induced.

In an embodiment, the first metal may include at least one of copper or germanium. The first partition wall layer L1 may include an aluminum-nickel-copper alloy. In an alternative embodiment, the first partition wall layer L1 may include an aluminum-nickel-germanium alloy. In an alternative embodiment, the first partition wall layer L1 may include an aluminum-nickel-copper-germanium alloy.

In an embodiment, the reduction reaction and the standard reduction potential of each of aluminum, nickel, copper, and germanium may be shown in Formulas 1 to 4.

$$Al^{3+}+3e^{-}\rightarrow Al-1.67\text{ V} \qquad \text{[Formula 1]}$$

$$Ni^{2+}+2e^{-}\rightarrow Ni-0.25\text{ V} \qquad \text{[Formula 2]}$$

$$Cu^{2+}+2e^{-}\rightarrow Cu+0.34\text{ V} \qquad \text{[Formula 3]}$$

$$Ge^{4+}+4e^{-}\rightarrow Ge+0.12\text{ V} \qquad \text{[Formula 4]}$$

Referring to Formulas 1 to 4, since the standard reduction potential of each of copper and germanium is higher than the standard reduction potential of each of aluminum and nickel, when copper or germanium is included in the metal film including or consisting of aluminum and nickel, etching of aluminum may be promoted due to the difference in ionization tendency from aluminum. Accordingly, selective etching of the aluminum-including or consisting of metal film may be effectively performed.

The content of aluminum with respect to the entirety of the first partition wall layer L1 may be about 97.0 atomic percentage (at %) to about 99.0 at %. The content of nickel with respect to the entirety of the first partition wall layer L1 may be about 0.5 at % to about 2.0 at %, and the content of the first metal may be about 0.1 at % to about 0.5 at %. The composition of elements included in the first partition wall layer L1 may be checked through inductively coupled plasma ("ICP"), x-ray photoelectron spectroscopy ("XPS"), and secondary ion mass spectrometry ("SIMS"). Nickel and the first metal among the components of the first partition wall layer L1 may control the etch rate of the first partition wall layer L1. That is, it may be possible to control the etch rate by controlling the proportion of each of nickel and the first metal included in the first partition wall layer L1.

Nickel included in the first partition wall layer L1 may serve to improve the etch selectivity, chemical resistance, electrical conductivity, etc. of the first partition wall layer L1. When the content of nickel is less than about 0.5 at %, the etching speed of aluminum may decrease in an undercut etching process, and thus the etching uniformity may be decreased. In addition, when the content of nickel is greater than about 2.0 at %, the etching may not be easily performed due to chemical resistance. When the content of nickel satisfies the previously-described range, the etching speed may be easily controlled, and it may be possible to etch the aluminum-including or consisting of metal film selectively and uniformly.

When the content of the first metal is less than about 0.1 at %, the etching speed of aluminum may decrease in the undercut etching process, and thus the etching uniformity may be decreased. In addition, when the content of the first metal is greater than about 0.5 at %, the etch selectivity of aluminum may increase, but defects may occur due to over-etching of aluminum during the etching process, and the excessive content of the first metal may cause increase of contact resistance between the first partition wall layer L1 and the cathode CE. When the content of the first metal satisfies the previously-described range, the etching speed may be easily controlled, and it may be possible to etch the aluminum-including or consisting of metal film selectively and uniformly.

In an embodiment, the first partition wall layer L1 may further include lanthanum. The first partition wall layer L1 may include aluminum, nickel, lanthanum, and the first metal. Lanthanum may serve to prevent a hillock phenomenon which may occur on the first partition wall layer L1. When the aluminum-including or consisting of metal film is exposed to a relatively high temperature, thermal stress may occur, and this may cause expansion of a surface of the metal film, so that the hillock phenomenon which causes grooves or cracks may occur. According to this embodiment of the inventive concept, since the first partition wall layer L1 includes lanthanum, the first partition wall layer L1 may be improved in heat resistance, so that the hillock phenomenon may not occur, and therefore, the reliability of the display device DD may be improved.

When the first partition wall layer L1 includes lanthanum, the content of lanthanum with respect to the entirety of the first partition wall layer L1 may be about 0.3 at % to about 0.5 at %. When the content of lanthanum is less than about 0.3 at %, the heat resistance for the first partition wall layer L1 may not be sufficiently secured, so that the hillock phenomenon may occur. In addition, the content of lanthanum is greater than about 0.5 at %, the contact resistance of the first partition wall layer L1 may increase, and the etching speed of aluminum may decrease in the etching process, thereby decreasing the etching uniformity. When the content of lanthanum satisfies the previously-described range, the hillock phenomenon may be effectively prevented on the first partition wall layer L1 including or consisting of aluminum, and the etching uniformity of the aluminum-including or consisting of metal film may be improved.

The first partition wall layer L1 may include an aluminum-nickel-lanthanum-first metal alloy. The aluminum-nickel-lanthanum-first metal alloy may be an aluminum-based alloy doped with nickel, lanthanum, and the first metal. In an embodiment, the first partition wall layer L1 may include an aluminum-nickel-lanthanum-copper alloy. In an embodiment, the first partition wall layer L1 may consist of the aluminum-nickel-lanthanum-copper alloy, for example. In an alternative embodiment, the first partition wall layer L1 may include an aluminum-nickel-lanthanum-germanium alloy. In an embodiment, the first partition wall layer L1 may consist of the aluminum-nickel-lanthanum-germanium alloy, for example.

In addition to aluminum, nickel, lanthanum, and the first metal, the first partition wall layer L1 may further include a metal material such as magnesium (Mg), chrome (Cr), manganese (Mn), ruthenium (Ru), rhodium (Rh), palladium (Pd), iridium (Ir), platinum (Pt), cerium (Ce), praseodymium (Pr), gadolinium (Gd), terbium (Tb), samarium (Sm), europium (Eu), holmium (Ho), erbium (Er), thorium (Tm), ytterbium (Yb), lutetium (Lu), titanium (Ti), vanadium (V), zirconium (Zr), hafnium (Hf), tantalum (Ta), tungsten (W), and dysprosium (Dy).

The thickness of the first partition wall layer L1 may be about 6000 angstroms (Å) to about 100000 Å.

As illustrated in FIG. 5, the cathode CE may contact the first inner side surface S1-P of the first partition wall layer L1, and may receive the second drive voltage ELVSS (refer to FIG. 3B) from the first partition wall layer L1.

The second partition wall layer L2 may be disposed on the first partition wall layer L1. The second partition wall layer L2 may be directly disposed on the first partition wall layer L1. The second partition wall layer L2 may define the tip portion formed on the partition wall PW. An upper surface of the second partition wall layer L2 may form the uppermost surface of the partition wall PW, and define an upper surface of the tip portion formed on the partition wall PW.

The second partition wall layer L2 may have a lower electrical conductivity than the first partition wall layer L1, but may include a material with relatively high rigidity. The second partition wall layer L2 may include a material having a relatively high Young's modulus of about 300 gigapascals (Gpa) or more. Since the second partition wall layer L2 includes a material having a relatively high Young's modulus, the degree of deformation of the second partition wall layer L2 may be reduced. As the degree of deformation of the second partition wall layer L2, which forms the uppermost surface of the tip portion, is reduced, robustness in the undercut form of the partition wall PW may be increased. Accordingly, a sagging form of the tip portion of the partition wall PW may be reduced or removed, and a form of the tip portion blocking the inner side surface of the partition wall PW contacted by the cathode CE may be reduced or removed.

In an embodiment, the second partition wall layer L2 may include second metal or a silicon-based compound.

In an embodiment, the second partition wall layer L2 may include the second metal. The second metal included in the second partition wall layer L2 may include gold (Au), silver (Ag), aluminum (Al), magnesium (Mg), lithium (Li), molybdenum (Mo), titanium (Ti), copper (Cu), or any alloys thereof. The second partition wall layer L2 may include a metal material different from that of the first partition wall layer L1. The second partition wall layer L2 may include, e.g., titanium (Ti). The thickness of the second partition wall layer L2 may be about 400 Å to about 800 Å.

In an embodiment, the second partition wall layer L2, unlike the first partition wall layer L1, may not include a metal material. The second partition wall layer L2 may include a silicon-based compound. The second partition wall layer L2 may include at least one of silicon oxide ($SiO_x$), silicon nitride ($SiN_x$), or silicon oxynitride ($SiO_xN_y$). The second partition wall layer L2 may include, e.g., silicon oxide ($SiO_x$). Since the second partition wall layer L2, unlike the first partition wall layer L1, is a component which is not in contact with the cathode CE, and which separates the cathode CE in each light-emitting region PXA by forming the tip portion, the second partition wall layer L2 may also include a silicon-based compound that is an insulating material.

FIG. 5 illustrates that each of the first inner side surface S1-P and the second inner side surface S2-P is perpendicular to an upper surface of the pixel-defining film PDL and extends along the third direction DR3, but the inventive concept is not limited thereto. In an embodiment, the partition wall PW may have a tapered shape, or an inversed tapered shape, for example.

The light-emitting pattern EP may be disposed on the anode AE. The light-emitting pattern EP may include a light-emitting layer including or consisting of a light-emitting material. The light-emitting pattern EP may further include a hole injection layer ("HIL") and a hole transport layer ("HTL") disposed between the anode AE and the light-emitting layer, and may further include an electron transport layer ("ETL") and an electron injection layer ("EIL") disposed on the light-emitting layer. The light-emitting pattern EP may also be also referred to as an 'organic layer' or a 'intermediate layer'.

The light-emitting pattern EP may be patterned by the tip portion defined on the partition wall PW. The light-emitting pattern EP may be disposed on inner sides of the sacrificial opening OP-S, the light-emitting opening OP-E, and the partition wall opening OP-P. The light-emitting pattern EP may cover a portion of the upper surface of the pixel-defining film PDL exposed from the partition wall opening OP-P.

The cathode CE may be disposed on the light-emitting pattern EP. The cathode CE may be patterned by the tip portion defined on the partition wall PW. The cathode CE may contact the first inner side surface S1-P of the first partition wall layer L1.

The partition wall PW may receive the second drive voltage ELVSS (refer to FIG. 3B), and accordingly, the cathode CE may be electrically connected to the partition wall PW, and receive the second drive voltage ELVSS (refer to FIG. 3B).

In an embodiment of the inventive concept, the display panel DP may further include a capping pattern CP. The capping pattern CP may be disposed in the partition wall opening OP-P, and disposed on the cathode CE. The capping pattern CP may be patterned by the tip portion formed on the partition wall PW.

FIG. 5 illustrates that the capping pattern CP is not in contact with the second inner side surface S2-P of the second partition wall layer L2, but the inventive concept is not limited thereto. In an embodiment, the capping pattern CP may be formed to contact the second inner side surface S2-P of the second partition wall layer L2, for example. In another embodiment of the inventive concept, the capping pattern CP may be omitted.

The dummy patterns DMP may be disposed on the partition wall PW. The dummy patterns DMP may include a first dummy pattern D1, a second dummy pattern D2, and a third dummy pattern D3. The first to third dummy patterns D1, D2, and D3 may be stacked in sequence on the upper surface of the second partition wall layer L2 of the partition wall PW along the third direction DR3.

The first dummy pattern D1 may include an organic material. In an embodiment, the first dummy pattern D1 may include the same material as that of the light-emitting pattern EP, for example. The first dummy pattern D1 may be simultaneously formed through one process together with the light-emitting pattern EP, and formed separately from the light-emitting pattern EP due to the undercut of the partition wall PW.

The second dummy pattern D2 may include a conductive material. In an embodiment, the second dummy pattern D2 may include the same material as that of the cathode CE, for example. The second dummy pattern D2 may be simultaneously formed through one process together with the cathode CE, and formed separately from the cathode CE due to the undercut of the partition wall PW.

The third dummy pattern D3 may include the same material as that of the capping pattern CP, for example. The third dummy pattern D3 may be simultaneously formed through one process together with the capping pattern CP, and formed separately from the capping pattern CP due to the undercut of the partition wall PW.

A dummy opening OP-D may be defined in the dummy patterns DMP. The dummy opening OP-D may correspond to the light-emitting opening OP-E. The dummy opening OP-D may include first to third regions AA1, AA2, and AA3 (refer to FIG. 8K) sequentially defined in the third direction DR3. The first region AA of the dummy opening OP-D may be defined by an inner side surface S1-D of the first dummy pattern D1, the second region AA2 may be defined by an inner side surface S2-D of the second dummy pattern D2, and the third region AA3 may be defined by an inner side surface S3-D of the third dummy pattern D3. On a plane, the first to third dummy patterns D1, D2, and D3 may each have a shape of a closed-line surrounding the light-emitting region PXA.

FIG. 5 illustrates that the inner side surfaces of the first to third dummy patterns D1, D2, and D3 are aligned with the second inner side surface S2-P of the second partition wall layer L2, but the inventive concept is not limited thereto. The first to third dummy patterns D1, D2, and D3 may also cover the second inner side surface S2-P of the second partition wall layer L2.

The thin-film encapsulation layer TFE may be disposed on the display element layer DP-OLED. The thin-film encapsulation layer TFE may include a lower inorganic encapsulation pattern LIL, an organic encapsulation film OL, and an upper inorganic encapsulation film UIL.

The lower inorganic encapsulation pattern LIL may correspond to the light-emitting opening OP-E. The lower inorganic encapsulation pattern LIL may cover the light-emitting element ED and the dummy patterns DMP, and a portion of the lower inorganic encapsulation pattern LIL may be disposed on an inner side of the partition wall opening OP-P. In an embodiment, the lower inorganic encapsulation pattern LIL may contact each of the first inner side surface S1-P of the first partition wall layer L1 and the second inner side surface S2-P of the second partition wall layer L2.

The organic encapsulation film OL may cover the lower inorganic encapsulation pattern LIL, and provide a flat upper surface. The upper inorganic encapsulation film UIL may be disposed on the organic encapsulation film OL.

The lower inorganic encapsulation pattern LIL and the upper inorganic encapsulation film UIL may protect the display element layer DP-OLED from moisture/oxygen, and the organic encapsulation film OL may protect the display element layer DP-OLED from foreign substances such as dust particles.

FIG. 6 is a cross-sectional view of an embodiment of a display panel according to the inventive concept. FIG. 6 is a cross-sectional view taken along line II-II' of FIG. 4. One first light-emitting region PXA-R, one second light-emitting region PXA-G, and one third light-emitting region PXA-B are enlarged and illustrated in FIG. 6, and the description of the light-emitting region PXA in FIG. 5 may equally apply to each of the first to third light-emitting regions PXA-R, PXA-G, and PXA-B.

Referring to FIG. 6, the display panel DP according to this embodiment may include a base layer BL, a circuit element layer DP-CL, a display element layer DP-OLED, and a thin-film encapsulation layer TFE. The display element layer DP-OLED may include light-emitting elements ED1, ED2, and ED3, sacrificial patterns SP1, SP2, and SP3, a pixel-defining film PDL, a partition wall PW, and dummy patterns DMP.

The light-emitting elements ED1, ED2, and ED3 may include a first light-emitting element ED1, a second light-emitting element ED2, and a third light-emitting element ED3. The first light-emitting element ED1 may include a first anode AE1, a first light-emitting pattern EPI, and a first cathode CE1. The second light-emitting element ED2 may include a second anode AE2, a second light-emitting pattern EP2, and a second cathode CE2. The third light-emitting element ED3 may include a third anode AE3, a third light-emitting pattern EP3, and a third cathode CE3. The first to third anodes AE1, AE2, and AE3 may be provided in a plurality of patterns. In an embodiment, the first light-emitting pattern EPI may provide red light, the second light-emitting pattern EP2 may provide green light, and the third light-emitting pattern EP3 may provide blue light.

First to third light-emitting openings OP1-E, OP2-E, and OP3-E may be defined in the pixel-defining film PDL. The first light-emitting opening OP1-E may expose at least a portion of the first anode AE1. The first light-emitting region PXA-R may be defined as a region of an upper surface of the first anode AE exposed by the first light-emitting opening OP1-E. The second light-emitting opening OP2-E may expose at least a portion of the second anode AE2. The second light-emitting region PXA-G may be defined as a region of an upper surface of the second anode AE2 exposed by the second light-emitting opening OP2-E. The third light-emitting opening OP3-E may expose at least a portion of the third anode AE3. The third light-emitting region PXA-B may be defined as a region of an upper surface of the third anode AE3 exposed by the third light-emitting opening OP3-E.

The sacrificial patterns SP1, SP2, and SP3 may include a first sacrificial pattern SP1, a second sacrificial pattern SP2, and a third sacrificial pattern SP3. The first to third sacrificial patterns SP1, SP2, and SP3 may be respectively disposed on the upper surfaces of the first to third anodes AE1, AE2, and AE3. First to third sacrificial openings OP1-S, OP2-S, and OP3-S, respectively corresponding to the first to third light-emitting openings OP1-E, OP2-E, and OP3-E, may be defined in the first to third sacrificial patterns SP1, SP2, and SP3, respectively.

In this embodiment, first to third partition wall openings OP1-P, OP2-P, and OP3-P, respectively corresponding to the first to third light-emitting openings OP1-E, OP2-E, and OP3-E, may be defined in the partition wall PW. The first to third partition wall openings OP1-P, OP2-P, and OP3-P may each include the first region A1 (refer to FIG. 8H) and the second region A2 (refer to FIG. 8H) previously described with reference to FIG. 5. A first partition wall layer L1 may include first inner side surfaces S1-P (refer to FIG. 5) each defining a portion of the first region A1 of each of the first to third partition wall openings OP1-P, OP2-P, and OP3-P. A second partition wall layer L2 may include second inner side surfaces S2-P (refer to FIG. 5) each defining the second region A2 of each of the first to third partition wall openings OP1-P, OP2-P, and OP3-P.

The first light-emitting pattern EPI and the first cathode CE1 may be disposed in the first partition wall opening OP1-P, the second light-emitting pattern EP2 and the second cathode CE2 may be disposed in the second partition wall opening OP2-P, and the third light-emitting pattern EP3 and the third cathode CE3 may be disposed in the third partition wall opening OP3-P. The first to third cathodes CE1, CE2, and CE3 may contact the first inner side surfaces S1-P of the first partition wall layer L1, respectively.

In this embodiment, the first to third cathodes CE1, CE2, and CE3 may be physically separated by the second partition wall layer L2, which forms the tip portion, to be formed respectively in the light-emitting openings OP1-E, OP2-E, and OP3-E, and may be electrically connected to each other by contacting to the first partition wall layer L1 to receive a common voltage. The first partition wall layer L1 contacted by each of the first to third cathodes CE1, CE2, and CE3 may have a relatively higher electrical conductivity than the second partition wall layer L2, thereby reducing contact resistance with the first to third cathodes CE1, CE2, and CE3. Accordingly, a common cathode voltage may be provided evenly to the light-emitting regions PXA-R, PXA-G, and PXA-B.

In an embodiment of the inventive concept, the plurality of light-emitting patterns EP1, EP2, and EP3 may be patterned and deposited in pixels by the tip portion defined in the partition wall PW. That is, the plurality of light-emitting patterns EPI, EP2, and EP3 may be formed in common by an open mask, but may be easily separated in pixels by the partition wall PW.

When the plurality of light-emitting patterns EPI, EP2, and EP3 are patterned by a fine metal mask ("FMM"), a supporting spacer protruding from the conductive partition wall needs to be provided to support the fine metal mask. In addition, since the fine metal mask is spaced apart from the base surface, on which the patterning is performed, by the heights of the partition wall and the spacer, there may be a limitation in providing a relatively high resolution. In addition, since the fine metal mask contacts the spacer, foreign substances may remain on the spacer after the patterning process of the plurality of light-emitting patterns EP1, EP2, and EP3, or the spacer may be damaged by the fine metal mask being stamped. Accordingly, a defective display panel may be formed.

According to this embodiment, since the partition wall PW is included, the light-emitting elements ED1, ED2, and ED3 may be physically separated with ease. Accordingly, a leakage of current, drive error, or the like between the adjacent light-emitting regions PXA-R, PXA-G, and PXA-B may be prevented, and it may be possible for each of the light-emitting elements ED1, ED2, and ED3 to operate independently.

In particular, since the plurality of light-emitting patterns EP1, EP2, and EP3 are patterned without using a mask that contacts inside components in the display region DA (refer to FIG. 1B), the defect rate may be decreased, thereby providing a display panel DP with improved reliability. Since the patterning is possible without an additional supporting spacer protruding from the partition wall PW, the areas of the light-emitting regions PXA-R, PXA-G, and PXA-B may be miniaturized, thereby providing a display panel DP capable of easily achieving a relatively high resolution.

In addition, in manufacturing a large-area display panel DP, omitting the manufacturing of a large-area mask may reduce the process cost, and make it possible to avoid effect of defects that may occur on the large-area mask, thereby providing a display panel DP with improved process reliability.

The capping patterns CP1, CP2, and CP3 may include a first capping pattern CP1, a second capping pattern CP2, and a third capping pattern CP3. The first to third capping patterns CP1, CP2, and CP3 may be respectively disposed on the first to third cathodes CE1, CE2, and CE3, and respectively disposed in the first to third partition wall openings OP1-P, OP2-P, and OP3-P.

The dummy patterns DMP may include a plurality of first dummy patterns D1, a plurality of second dummy patterns D2, and a plurality of third dummy patterns D3.

The first dummy patterns D1 may include a (1-1)-th to (1-3)-th dummy patterns D11, D12, and D13 respectively surrounding the first to third light-emitting regions PXA-R, PXA-G, and PXA-B in a plan view. The (1-1)-th to (1-3)-th dummy patterns D11, D12, and D13 may include the same materials as that of the first to third light-emitting patterns EP1, EP2, and EP3, respectively, and may be formed through the same processes as that of the first to third light-emitting patterns EP1, EP2, and EP3, respectively.

The second dummy patterns D2 may include a (2-1)-th to (2-3)-th dummy patterns D21, D22, and D23 respectively surrounding the first to third light-emitting regions PXA-R, PXA-G, and PXA-B in a plan view. The (2-1)-th to (2-3)-th dummy patterns D21, D22, and D23 may include the same materials as that of the first to third cathodes CE1, CE2, and CE3, respectively, and may be formed through the same processes as that of the first to third cathodes CE1, CE2, and CE3, respectively.

The third dummy patterns D3 may include a (3-1)-th to (3-3)-th dummy patterns D31, D32, and D33 respectively surrounding the first to third light-emitting regions PXA-R, PXA-G, and PXA-B. The (3-1)-th to (3-3)-th dummy patterns D31, D32, and D33 may include the same materials as that of the first to third capping patterns CP1, CP2, and CP3, respectively, and may be formed through the same processes as that of the first to third capping patterns CP1, CP2, and CP3, respectively.

First to third dummy openings OP1-D, OP2-D, and OP3-D respectively corresponding to the first to third light-emitting openings OP1-E, OP2-E, and OP3-E may be defined in the dummy patterns DMP. The first to third dummy openings OP1-D, OP2-D, and OP3-D may each include first to third regions AA1, AA2, and AA3 (refer to FIG. 8K) sequentially defined in the third direction DR3. The first dummy opening OP1-D may be defined by inner side surfaces of the (1-1)-th, (2-1)-th, and (3-1)-th dummy patterns D11, D21, and D31, the second dummy opening OP2-D may be defined by inner side surfaces of the (1-2)-th, (2-2)-th, and (3-2)-th dummy patterns D12, D22, and D32, and the third dummy opening OP3-D may be defined by inner side surfaces of the (1-3)-th, (2-3)-th, and (3-3)-th dummy patterns D13, D23, and D33.

The thin-film encapsulation layer TFE may include lower inorganic encapsulation patterns LIL1, LIL2, and LIL3, an organic encapsulation film OL, and an upper inorganic encapsulation film UIL. In this embodiment, the lower inorganic encapsulation patterns LIL1, LIL2, and LIL3 may include a first lower inorganic encapsulation pattern LIL1, a second lower inorganic encapsulation pattern LIL2, and a third lower inorganic encapsulation pattern LIL3. The first to third lower inorganic encapsulation patterns LIL1, LIL2, and LIL3 may respectively correspond to the first to third light-emitting openings OP1-E, OP2-E, and OP3-E.

The first lower inorganic encapsulation pattern LIL1 may cover the first light-emitting element ED1 and the (1-1)-th, (2-1)-th, and (3-1)-th dummy patterns D11, D21, and D31, and a portion of the first lower inorganic encapsulation pattern LIL1 may be disposed on an inner side of the first partition wall opening OP1-P. The second lower inorganic encapsulation pattern LIL2 may cover the second light-emitting element ED2 and the (1-2)-th, (2-2)-th, and (3-2)-th dummy patterns D12, D22, and D32, and a portion of the second lower inorganic encapsulation pattern LIL2 may be disposed on an inner side of the second partition wall opening OP2-P. The third lower inorganic encapsulation pattern LIL3 may cover the third light-emitting element ED3 and the (1-3)-th, (2-3)-th, and (3-3)-th dummy patterns D13, D23, and D33, and a portion of the third lower inorganic encapsulation pattern LIL3 may be disposed on an inner side of the third partition wall opening OP3-P. The first to third lower inorganic encapsulation patterns LIL1, LIL2, and LIL3 may be provided in the patterns spaced apart from each other.

Figure 7:
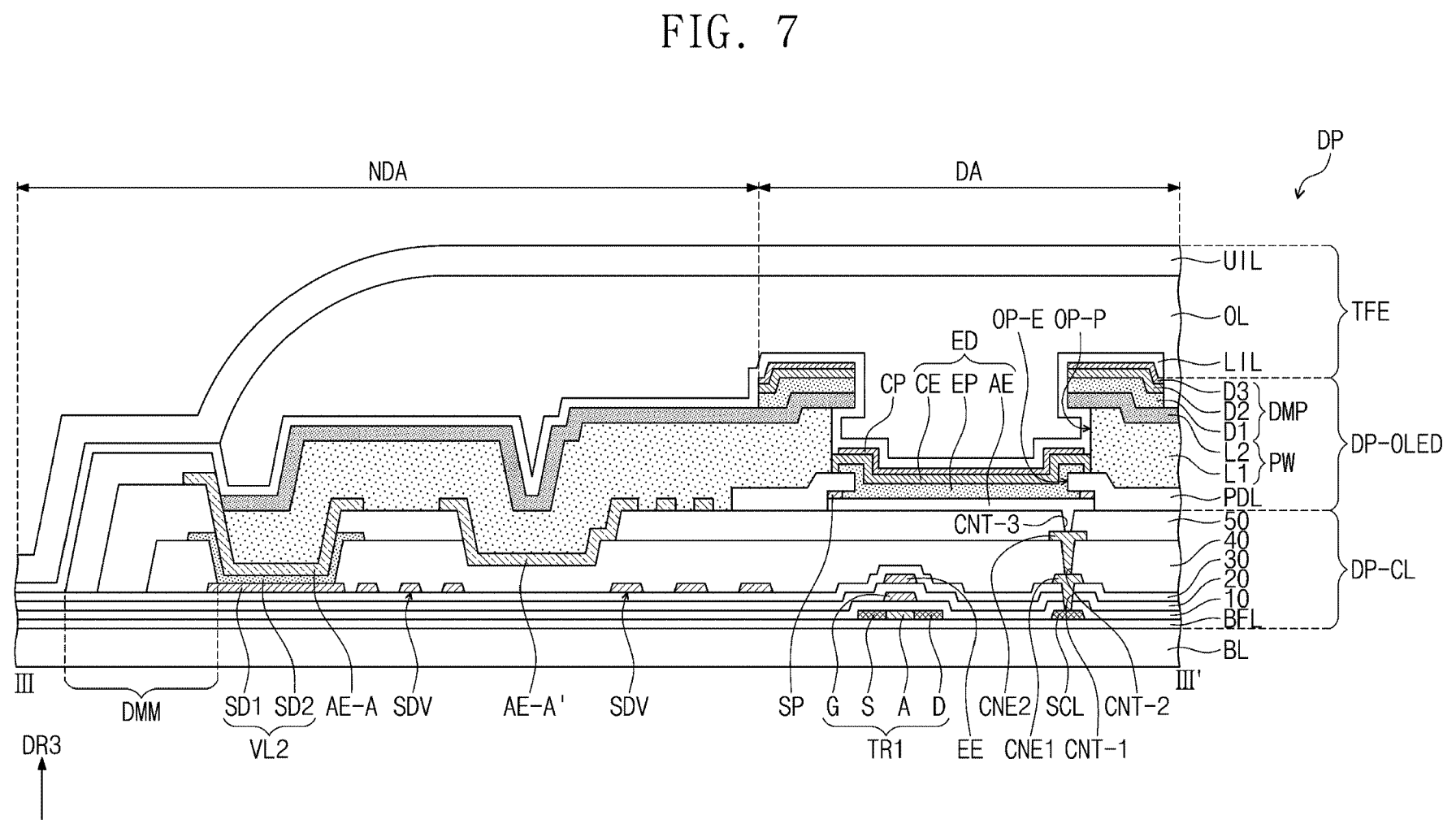

FIG. 7 is a cross-sectional view of the display panel taken along line III-III' of FIG. 3A. FIG. 7 illustrates enlarged non-display region NDA and display region DA that is adjacent to the non-display region NDA of the display panel DP. Same/similar components as the components described with reference to FIGS. 1A to 6 are denoted as same/similar reference symbols or numbers, and the duplicate descriptions will be omitted.

Referring to FIG. 7, a second drive voltage line VL2 may be disposed in the non-display region NDA. In this embodiment, the second drive voltage line VL2 may include a plurality of layers. In an embodiment, the second drive voltage line VL2 may include a first electrode layer SD1 and a second electrode layer SD2, for example.

The first electrode layer SD1 may be disposed on a third insulation layer 30. The first electrode layer SD1 may be formed through the same process as that of a first connection electrode CNE1, and may include the same material and have the same structure as that of the first connection electrode CNE1. At least a portion of the first electrode layer SD1 may be exposed from a fourth insulation layer 40, a fifth insulation layer 50, and a pixel-defining film PDL.

A second electrode layer SD2 may cover an end of the fourth insulation layer 40, and may be disposed on the first electrode layer SD1 exposed from the fourth insulation layer 40. That is, as disposed by contacting an upper surface of the first electrode layer SD1, the second electrode layer SD2 may be electrically connected to the first electrode layer SD1. The second electrode layer SD2 may be formed through the same process as that of a second connection electrode CNE2, and may include the same material and have the same structure as that of the second connection electrode CNE2.

However, the inventive concept is not limited thereto, and the second drive voltage line VL2 may include either of the first electrode layer SD1 or the second electrode layer SD2.

An auxiliary electrode AE-A may be disposed on the second drive voltage line VL2. In particular, the auxiliary electrode AE-A may cover an end of the fifth insulation layer 50, and may be disposed on the second electrode layer SD2. That is, as disposed by contacting an upper surface of the second electrode layer SD2, the auxiliary electrode AE-A may be electrically connected to the second drive voltage line VL2. The auxiliary electrode AE-A may be formed through the same process as that of an anode AE, and may include the same material and have the same structure as those of the anode AE. In an embodiment, the auxiliary electrode AE-A may include ITO/Ag/ITO.

A partition wall PW may overlap the non-display region NDA. The partition wall PW may extend from the display region DA to a portion of the non-display region NDA where the second drive voltage line VL2 is disposed. The partition wall PW may be directly in contact with the auxiliary electrode AE-A disposed on the second drive voltage line VL2. Accordingly, the partition wall PW may receive the second drive voltage ELVSS (refer to FIG. 3B) from the second drive voltage line VL2 through the auxiliary electrode AE-A, and the cathode CE which contacts the partition wall PW in the display region DA may receive the second drive voltage ELVSS (refer to FIG. 3B) through the partition wall PW. According to this embodiment, since the second drive voltage ELVSS (refer to FIG. 3B) is transmitted to the cathode CE through the partition wall PW having a relatively large thickness, the voltage drop phenomenon may be reduced.

A scan driver SDV may include a plurality of thin-film transistors formed through the same process as the conductive patterns of the pixel circuit PDC (refer to FIG. 3B). FIG. 7 illustrates that the thin-film transistors constituting the scan driver SDV are disposed on the third insulation layer 30.

A dam DMM may be disposed in the non-display region NDA. The dam DMM may consist of a plurality of insulation layers. In an embodiment, the dam DMM may include a first layer formed through the same process as that of the fourth insulation layer 40, a second layer formed through the same process as that of the fifth insulation layer 50, and a third layer formed through the same process as that of the pixel-defining film PDL, for example. However, the inventive concept is not limited thereto, and unlike what is illustrated in FIG. 7, the dam DMM may also have a single-layer or double-layer structure, and may include at least four layers.

A lower inorganic encapsulation pattern LIL, an organic encapsulation film OL, and an upper inorganic encapsulation film UIL may be disposed in the non-display region NDA. The organic encapsulation film OL may extend from the display region DA to a region where the dam DMM is disposed. The dam DMM may serve to control flow of monomers when the organic encapsulation film OL is formed. The lower inorganic encapsulation pattern LIL and the upper inorganic encapsulation film UIL may extend from the display region DA to a region where the dam DMM is disposed, and cover the dam DMM, and may contact each other on the dam DMM to seal the organic encapsulation film OL.

In an embodiment, the display panel DP may further include an additional auxiliary electrode AE-A'. The additional auxiliary electrode AE-A' may contact a first partition wall layer L1 of the partition wall PW. Accordingly, the area of a portion, in which the first partition wall layer L1 contacts an electrode for providing a drive voltage, may be increased, and contact resistance of the first partition wall layer L1 may be reduced. The additional auxiliary electrode AE-A' may be formed through the same process as that of the anode AE, and may include the same material and have the same composition as the anode AE. In another embodiment, the additional auxiliary electrode AE-A' may be omitted.

Figure 8I:
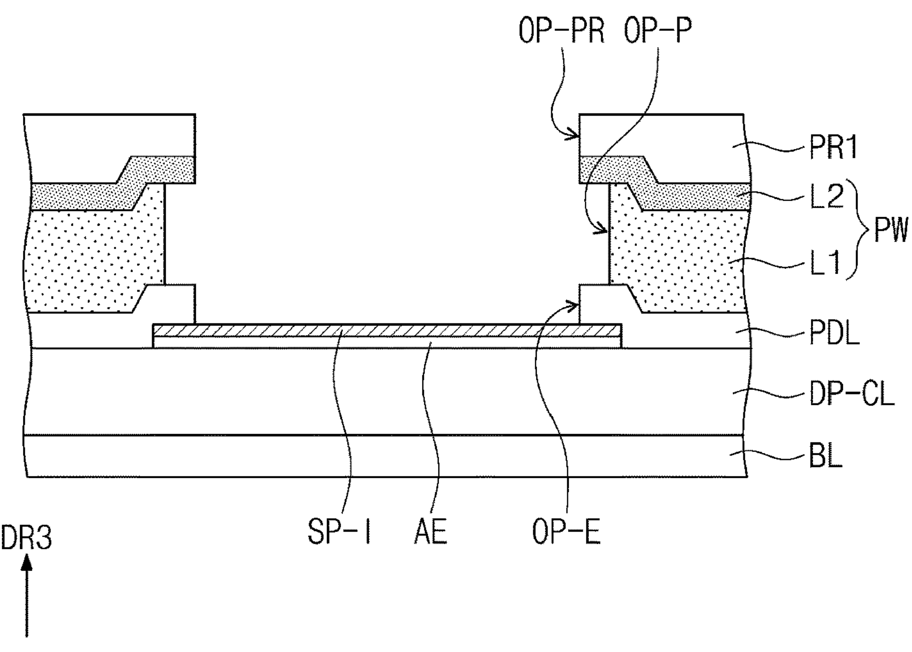
Figure 8J:
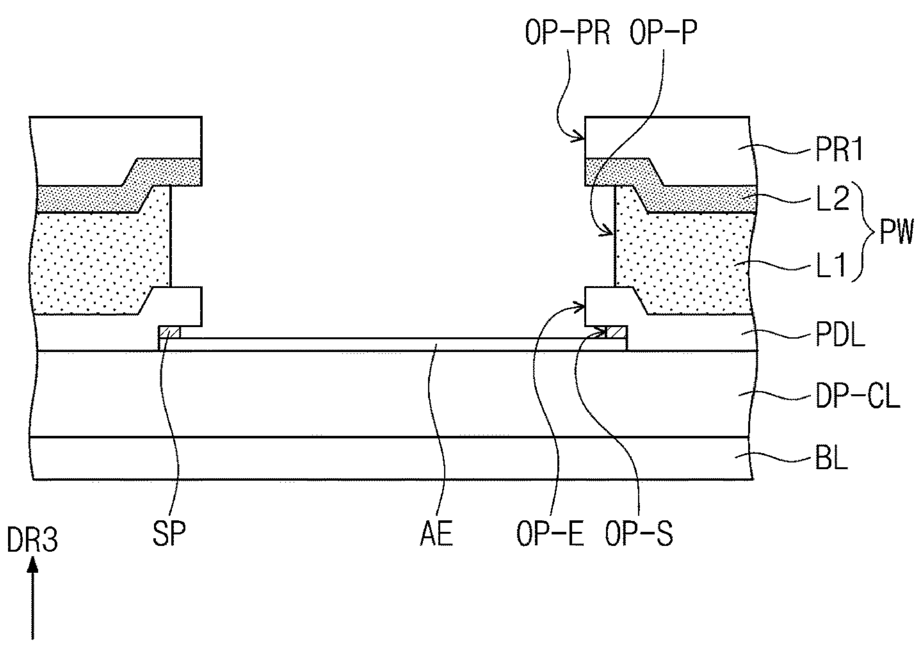
Figure 8K:
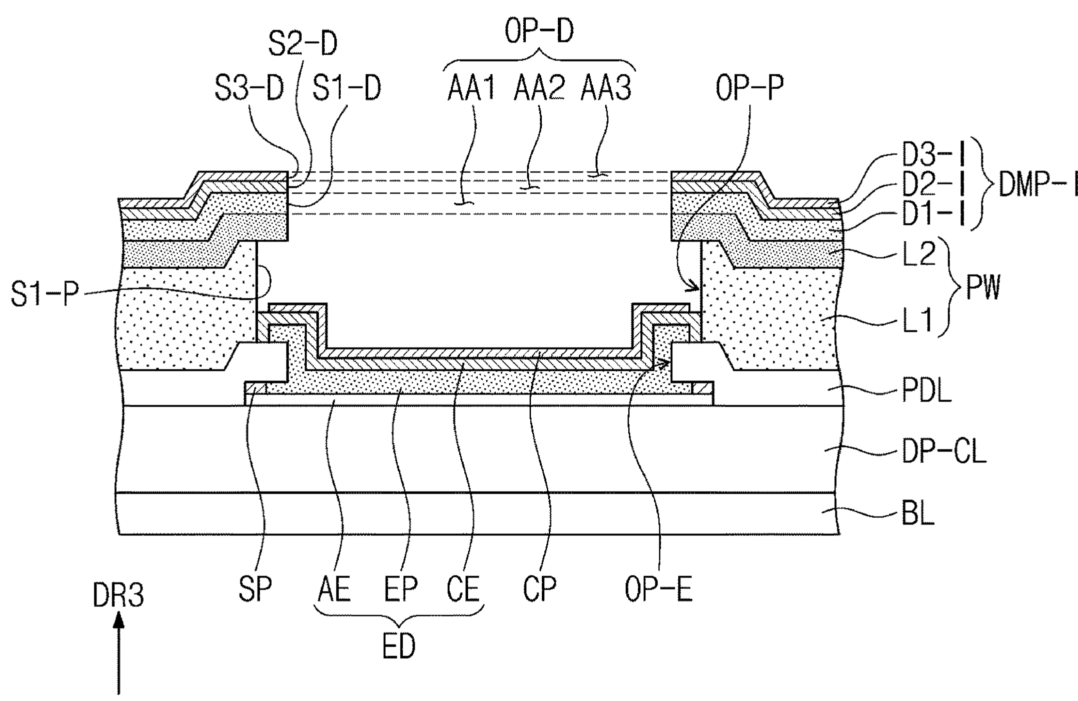
Figure 8L:
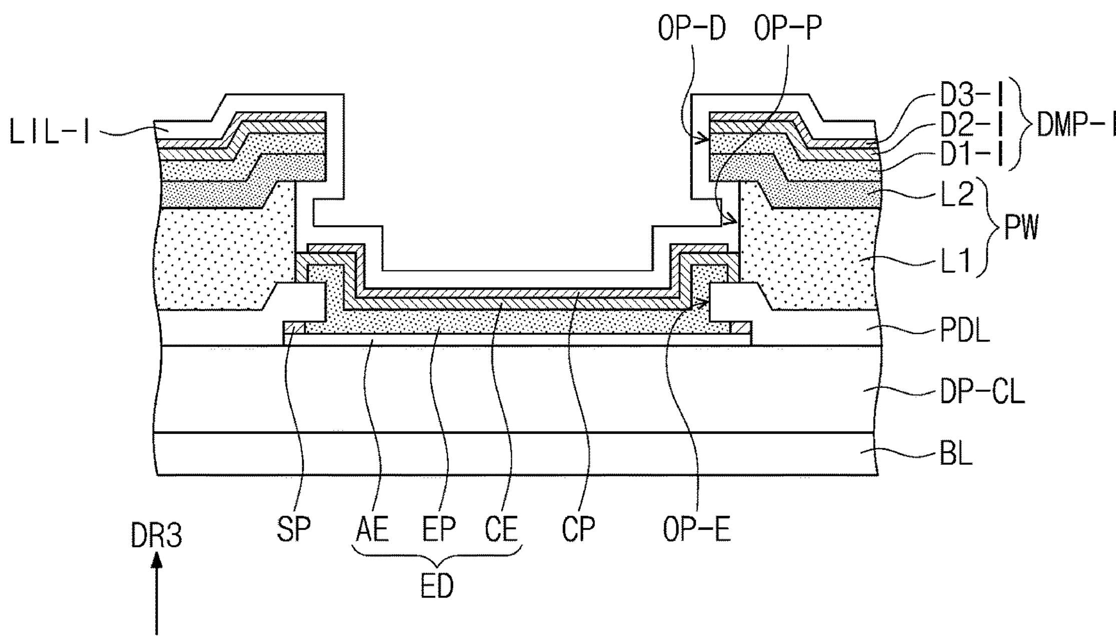
Figure 8M:
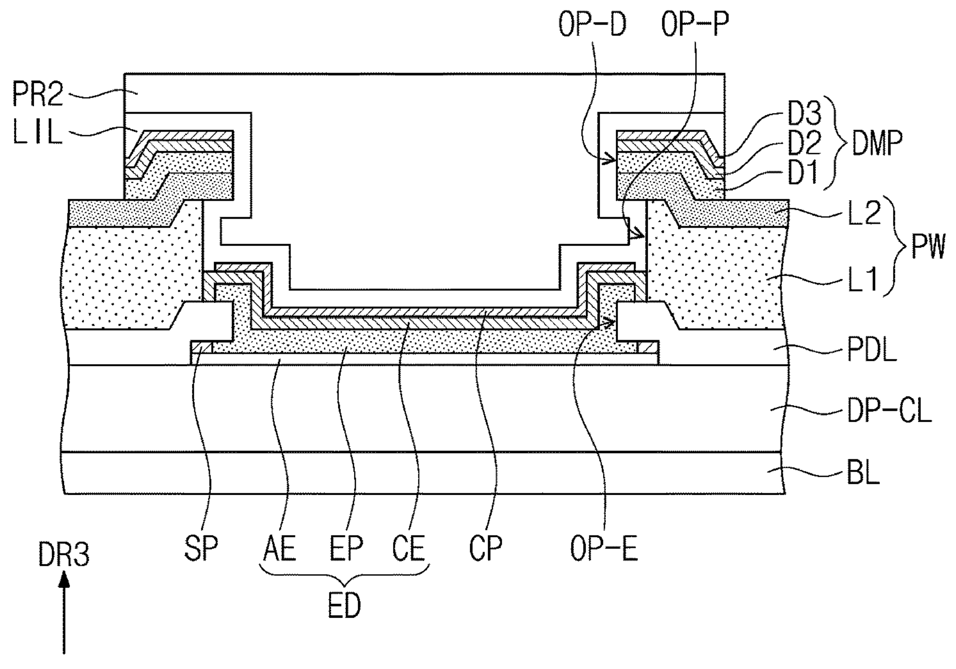
Figure 8N:
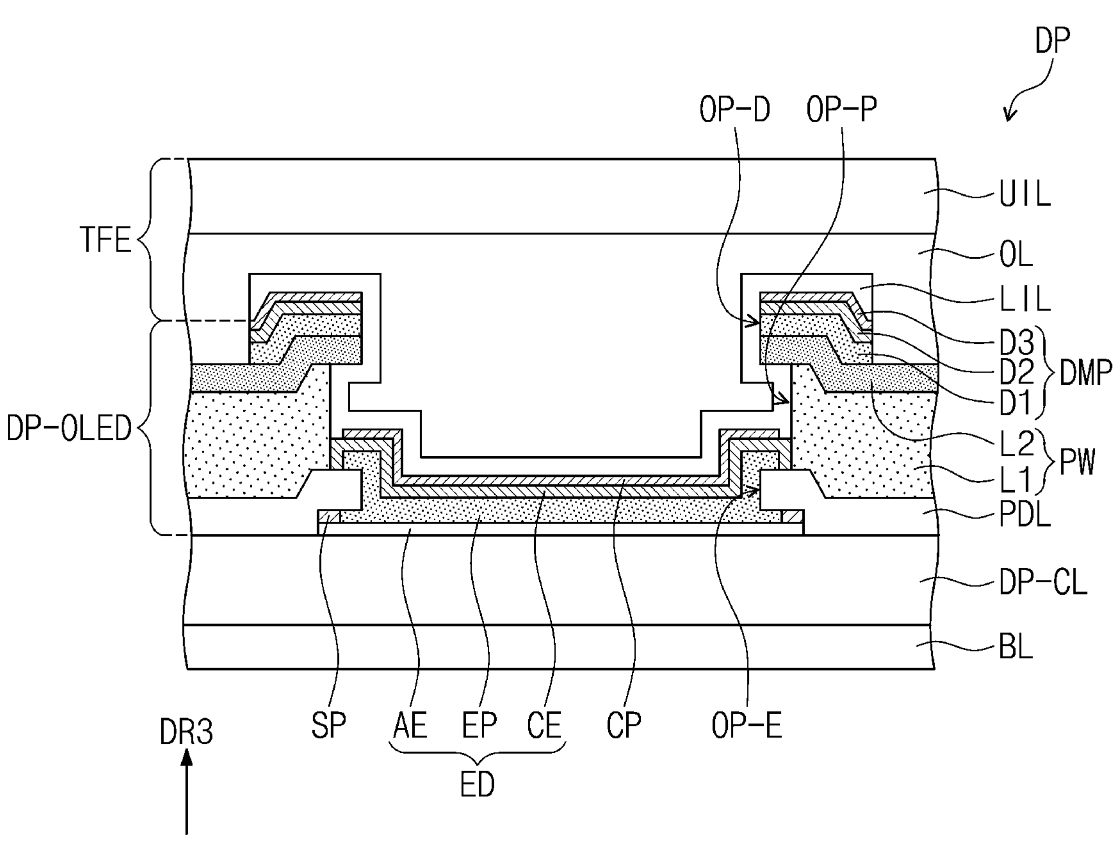

FIGS. 8A to 8N are cross-sectional views illustrating an embodiment of some operations among operations of a manufacturing method for a display panel according to the inventive concept. For descriptions with reference to FIGS. 8A to 8N, same/similar components will be denoted as same/similar reference numerals or symbols with reference to FIGS. 1A to 7, and the duplicate descriptions will be omitted.

The manufacturing method for the display panel in an embodiment of the inventive concept may include providing a preliminary display panel including a base layer, an anode disposed on the base layer, and a pixel-defining film which is disposed on the base layer and in which a light-emitting opening that exposes a portion of the anode is defined, forming, on the preliminary display panel, a first preliminary partition wall layer including first metal, aluminum, and nickel, forming, on the first preliminary partition wall layer, a second preliminary partition wall layer including second metal or a silicon-based compound, etching the first and second preliminary partition wall layers to form a partition wall where a partition wall opening is defined, and forming, in the partition wall opening, a light-emitting pattern and a cathode which contacts the partition wall.

Referring to FIG. 8A, the manufacturing method for the display panel according to this embodiment may include providing a preliminary display panel DP-I. The preliminary display panel DP-I according to this embodiment may include a base layer BL, a circuit element layer DP-CL, an anode AE, a preliminary sacrificial pattern SP-I, and a preliminary pixel-defining film PDL-I.

The circuit element layer DP-CL may be formed through a general circuit element manufacturing process in which an insulation layer, a semiconductor layer, and a conductive layer are formed through coating, deposition, etc., and the insulation layer, the semiconductor layer, and the conductive layer are selectively patterned through a photolithography or an etching process, so that a semiconductor pattern, a conductive pattern, a signal line, or the like are formed.

The anode AE and the preliminary sacrificial pattern SP-I may be formed through the same patterning process. The preliminary pixel-defining film PDL-I may cover both of the anode AE and the preliminary sacrificial pattern SP-I.

After this, referring to FIG. 8B, the manufacturing method for the display panel according to this embodiment may include forming a first preliminary partition wall layer L1-I on the preliminary pixel-defining film PDL-I. The forming of the first preliminary partition wall layer L1-I may be performed in a deposition process of a conductive material. In this embodiment, the conductive material forming the first preliminary partition wall layer L1-I may include relatively low resistance metal. In an embodiment, the conductive material forming the first preliminary partition wall layer L1-I may include aluminum, nickel, and first metal, for example. The conductive material forming the first preliminary partition wall layer L1-I may be an aluminum-nickel-first metal alloy. In an alternative embodiment, the conductive material forming the first preliminary partition wall layer L1-I may include aluminum, nickel, lanthanum, and the first metal. The conductive material forming the first preliminary partition wall layer L1-I may be an aluminum-nickel-lanthanum-first metal alloy.

After this, referring to FIG. 8C, the manufacturing method for the display panel according to this embodiment may include forming a second preliminary partition wall layer L2-I on the first preliminary partition wall layer L1-I for a preliminary partition wall PW-I to be formed.

The forming of the second preliminary partition wall layer L2-I may be performed in a deposition process of a conductive material. In an embodiment, the conductive material forming the second preliminary partition wall layer L2-I may be a metal material. In an embodiment, the conductive material forming the second preliminary partition wall layer L2-I may be gold (Au), silver (Ag), aluminum (Al), magnesium (Mg), lithium (Li), molybdenum (Mo), titanium (Ti), copper (Cu), or any alloys thereof, for example. The metal forming the second preliminary partition wall layer L2-I may be different from the metal forming the first preliminary partition wall layer L1-I. The metal forming the second preliminary partition wall layer L2-I may be, e.g., titanium (Ti).

In an embodiment, the second preliminary partition wall layer L2-I may not include a metal material. The second preliminary partition wall layer L2-I may include or consist of a silicon-based compound. In an embodiment, the second preliminary partition wall layer L2-I may include at least one of silicon oxide ($SiO_x$), silicon nitride ($SiN_x$), or silicon oxynitride ($SiO_xN_y$), for example.

The preliminary partition wall PW-I may include the first preliminary partition wall layer L1-I and the second preliminary partition wall layer L2-I.

After this, referring to FIG. 8D, the manufacturing method for the display panel according to this embodiment may include forming a first photoresist layer PR1 on the preliminary partition wall PW-I. The first photoresist layer PR1 may be formed in a way that a preliminary photoresist layer is formed on the preliminary partition wall PW-I, and then is patterned by a photo mask. Through the patterning process, a photo opening OP-PR overlapping the anode AE may be formed on the first photoresist layer PR1.

After this, referring to FIGS. 8E to 8H, the manufacturing method for the display panel according to this embodiment may include etching the first preliminary partition wall layer L1-I and the second preliminary partition wall layer L2-I for a partition wall PW to be formed from the preliminary partition wall PW-I. The etching of the preliminary partition wall PW-I may be performed twice. The etching of the first preliminary partition wall layer L1-I and the second preliminary partition wall layer L2-I may include performing a first etching and performing a second etching.

Referring to FIG. 8E, in the performing of the first etching on the first preliminary partition wall layer L1-I and on the second preliminary partition wall layer L2-I, the first photoresist layer PR1 may be used as a mask, and performing a dry etching on the first preliminary partition wall layer L1-I and on the second preliminary partition wall layer L2-I may be included. Since the first preliminary partition wall layer L1-I and the second preliminary partition wall layer L2-I include or consist of metal materials, a first dry-etching process may be easily performed.

In this embodiment, the first dry-etching process may be performed in an etching condition where the first preliminary partition wall layer L1-I and the second preliminary partition wall layer L2-I have substantially the same etch selectivity. Accordingly, an inner side surface of the first preliminary partition wall layer L1-I and an inner side surface of the second preliminary partition wall layer L2-I that define a preliminary partition wall opening OP-P1 may be substantially aligned with each other.

After this, referring to FIG. 8F, the second etching may be performed on the first preliminary partition wall layer L1-I after the performing of the first etching on the first preliminary partition wall layer L1-I and on the second preliminary partition wall layer L2-I. In the performing of the second etching on the first preliminary partition wall layer L1-I, the first photoresist layer PR1 may be used as a mask, and performing a wet etching on the first preliminary partition wall layer L1-I to form a partition wall opening OP-P may be included. In this specification, the performing of the second etching on the first preliminary partition wall layer L1-I may be also referred to as an "undercut etching process".

In an embodiment, the performing of the second etching on the first preliminary partition wall layer L1-I may include providing a chemical solution EC to the first preliminary partition wall layer L1-I to etch the first preliminary partition wall layer L1-I. In this specification, the chemical solution may refer to a treatment liquid used for an etching process in a manufacturing process for a display device.

In this embodiment, a second wet-etching process may be performed in a condition where the etch selectivity between the first preliminary partition wall layer L1-I and the second preliminary partition wall layer L2-I is large. Accordingly, an inner side surface of the partition wall PW defining the partition wall opening OP-P may have an undercut in a cross-section. In an embodiment, the etch rate of the first preliminary partition wall layer L1-I may be larger than the etch rate of the second preliminary partition wall layer L2-I. Accordingly, the degree to which the first preliminary partition wall layer L1-I is etched may be larger than that of the second preliminary partition wall layer L2-I, and a first inner side surface S1-P of a first partition wall layer L1 to be formed later may be recessed further inward than a second inner side surface S2-P of a second partition wall layer L2. A tip portion may be formed from a portion of the second partition wall layer L2 further protruding than the first partition wall layer L1 in a direction toward the center of the anode AE.

In an embodiment, the chemical solution EC used in the performing of the second etching on the first preliminary partition wall layer L1-I may be an alkaline chemical solution. The alkaline chemical solution may include inorganic alkalis, amines, quaternary ammonium salts, or the like. The alkaline chemical solution may be an alkaline solution including or consisting of at least one of inorganic alkalis, amines, or quaternary ammonium salts.

The inorganic alkalis may be, e.g., alkaline metal such as sodium hydroxide, potassium hydroxide, sodium carbonate, sodium silicate, or sodium metasilicate, or alkaline earth metal such as magnesium hydroxide, or calcium hydroxide. The amines may be, e.g., primary amines such as methylamine, ethylamine, or propylamine, secondary amines such as dimethylamine, diethylamine, or dibutylamine, tertiary amines such as trimethylamine, triethylamine, or methyldiethylamine, alcohol amines such as dimethylethanolamine or triethanolamine, or cyclic amines such as pyrrole or piperidine. The quaternary ammonium salt may be, e.g., tetramethylammonium hydroxide, tetraethylammonium hydroxide, or the like.

In an embodiment, the alkaline chemical solution may include at least one of potassium hydroxide or tetramethylammonium hydroxide. In an embodiment, the alkaline chemical solution may be an alkaline solution including or consisting of potassium hydroxide or tetramethylammonium hydroxide, for example.

In an embodiment, in the performing of the second etching on the first preliminary partition wall layer L1-I, the alkaline chemical solution is used as an etching solution, thereby preventing damages to a lower thin film which may occur during the etching process. When the first preliminary partition wall layer L1-I is etched with an etching solution such as an acidic chemical solution, not the alkaline chemical solution, in order to form the partition wall PW, metal under the partition wall may be over-etched, so that a thin film of the sacrificial pattern SP, the anode AE, or the like may be damaged. In an embodiment of the inventive concept, since the alkaline chemical solution is used as an etching solution in the performing of the second etching on the first preliminary partition wall layer L1-I, it may be possible to prevent damages to the lower thin film, other than the first partition wall layer L1, thereby further improving the reliability of the display device DD.

In an embodiment, the first preliminary partition wall layer L1-I may include aluminum, nickel, and first metal. Since the first preliminary partition wall layer L1-I includes nickel and the first metal, the ease of etching may be improved. When nickel and the first metal, each of which has a higher standard reduction potential than aluminum, are applied to the first preliminary partition wall layer L1-I including or consisting of aluminum, ionization of aluminum may be induced to promote the etching speed. The contents described with reference to FIG. 5 may be equally applied to the contents of the first metal.

Referring to FIG. 8G, in the performing of the second etching on the first preliminary partition wall layer L1-I, the chemical solution EC may be provided to the first preliminary partition wall layer L1-I. In an embodiment, the inner side surface of the first preliminary partition wall layer L1-I may be exposed to the chemical solution EC, for example. In FIG. 8G, A may correspond to aluminum, A' may correspond to aluminum ion, B may correspond to the first metal, and B' may correspond to first metal ion. In an embodiment, A may be Al, A' may be $Al^{3+}$. B may be Cu or Ge, and B' may be $Cu^{2+}$ or $Ge^{4+}$, for example. For the convenience of description, FIG. 8G illustrates that nickel is omitted.

Referring to FIG. 8G, when the first preliminary partition wall layer L1-I including or consisting of aluminum A, nickel, and the first metal B is exposed to the chemical solution EC, the ionization tendency of aluminum A is relatively higher than those of nickel and the first metal B, so that the etching of aluminum A may be induced. In addition, the first metal B has a higher standard reduction potential than nickel, so that the etching of aluminum A on the first preliminary partition wall layer L1-I may be further promoted. That is, since the standard reduction potential of the first metal B is higher than the standard reduction potential of each of aluminum A and nickel, when the first metal B is included in the first preliminary partition wall layer L1-I including or consisting of aluminum A and nickel, the ionization tendency of aluminum A may be increased, and thus the etching of aluminum A may be promoted. Accordingly, the selective etching of the first preliminary partition wall layer L1-I may be effectively performed.

In an embodiment, the first preliminary partition wall layer L1-I may further include lanthanum. The first preliminary partition wall layer L1-I may include aluminum, nickel, lanthanum, and the first metal. Lanthanum may serve to prevent a hillock phenomenon which may occur on the first partition wall layer L1 to be formed later.

In an embodiment, the first preliminary partition wall layer L1-I may include an aluminum-nickel-lanthanum-first metal alloy. In an embodiment, the first preliminary partition wall layer L1-I may include an aluminum-nickel-lanthanum-copper alloy. In an embodiment, the first preliminary partition wall layer L1-I may consist of the aluminum-nickel-lanthanum-copper alloy, for example. In an alternative embodiment, the first preliminary partition wall layer L1-I may include an aluminum-nickel-lanthanum-germanium alloy. In an embodiment, the first preliminary partition wall layer L1-I may consist of the aluminum-nickel-lanthanum-germanium alloy, for example.

In addition to aluminum, nickel, lanthanum, and the first metal, the first preliminary partition wall layer L1-I may further include a metal material such as magnesium (Mg), chrome (Cr), manganese (Mn), ruthenium (Ru), rhodium (Rh), palladium (Pd), iridium (Ir), platinum (Pt), cerium (Ce), praseodymium (Pr), gadolinium (Gd), terbium (Tb), samarium (Sm), europium (Eu), holmium (Ho), erbium (Er), thorium (Tm), ytterbium (Yb), lutetium (Lu), titanium (Ti), vanadium (V), zirconium (Zr), hafnium (Hf), tantalum (Ta), tungsten (W), or dysprosium (Dy).

Table 1 shows the etch rate of each metal for the alkaline chemical solution. In Table 1, Example corresponds to an AlNiLaCu metal film, the content of Ni with respect to the entirety of the metal film is about 0.6 at %, the content of La is about 0.5 at %, and the content of Cu is about 0.5 at %. Comparative Example corresponds to an A1 metal film including or consisting of a relatively small amount of Ni, and the content of Ni with respect to the entirety of the metal film is about 0.02 at %. In Table 1, the etch rate is measured by 2.38% of a tetramethylammonium hydroxide ("TMAH") solution as an alkaline chemical solution.

TABLE 1

| Classification | Embodiment (AlNiLaCu) | Comparative Example (Al) |
|---|---|---|
| TMAH (2.38%) | 25~30 nm/min | <20 nm/min |

Referring to Table 1, it may be seen that Embodiment shows a relatively high etch rate of 25 nm/min to 30 nm/min while Comparative Example shows a relatively low etch rate less than 20 nm/min. In the metal film etching process using the alkaline chemical solution, the etch rate may be affected according to the kind of metal included in the metal film. In Comparative Example, the first metal is not included, so that the etch rate for the alkaline chemical solution is relatively low and thus etching selectivity may be decreased. In addition, it may be seen that in Comparative Example, nickel is included, but due to the relatively low content thereof, the etch rate is not sufficiently secured. Therefore, when the metal film in Comparative Example is applied to the first partition wall layer, the process efficiency may be decreased due to relatively low etching selectivity for the alkaline chemical solution, and thus the desired etch profile may not be achieved. It may be seen that the metal film in Embodiment has a relatively high etch rate for the alkaline chemical solution, and has a tendency to be etched faster than the metal film in Comparative Example in the etching process, and thus the etching selectivity is improved. When the metal film is processed with the alkaline chemical solution, the ionization of metal may be induced on a surface of the metal film. In Embodiment, since the metal film includes nickel and copper each of which has a higher standard reduction potential than that of aluminum, aluminum is oxidized faster on the surface of the metal film, so that the etching speed may be increased. In order to form the partition wall PW having a tip portion, increasing the etching selectivity of the first preliminary partition wall layer L1-I may be desired. In an embodiment of the inventive concept, since the first preliminary partition wall layer L1-I includes nickel and the first metal, the degree of ionization of aluminum in the etching reaction may be increased, and accordingly, in the second etching which is desired to etch with relatively high selectivity, the etching selectivity of the first preliminary partition wall layer L1-I may be improved.

In an embodiment, the first preliminary partition wall layer L1-I may have an etch rate of about 25 nm/min to about 100 nm/min for the chemical solution EC. In an embodiment, the first preliminary partition wall layer L1-I may have an etch rate of about 25 nm/min to about 100 nm/min for the alkaline chemical solution, for example. The first preliminary partition wall layer L1-I may be etched at an etch rate of about 25 nm/min to about 100 nm/min for the chemical solution EC in the performing of the second etching on the first preliminary partition wall layer L1-I. The etch rate of the first preliminary partition wall layer L1-I may be appropriately controlled by changing the contents of nickel and the first metal, or by changing the concentration of the chemical solution to be used.

In the manufacturing method for the display device in an embodiment of the inventive concept, since the first preliminary partition wall layer L1-I includes nickel and the first metal, the selective etching speed of aluminum in the metal film including or consisting of aluminum may be increased, thereby improving the process reliability. The first partition wall layer L1 may be formed through an etching process, and an etching solution including or consisting of the alkaline chemical solution may be applied in order to prevent damages to a lower thin film, such as the sacrificial pattern or anode, which may occur during the etching process of the first partition wall layer L1. When the first partition wall layer L1 includes only aluminum, the etching speed for the alkaline chemical solution is low, so that the process efficiency may be decreased. In an embodiment of the inventive concept, since the first partition wall layer L1 includes aluminum, and includes nickel and the first metal each having a higher standard reduction potential than that of aluminum, the etching speed for the alkaline chemical solution may be increased and the process efficiency may be improved, and the damages to the lower thin film other than the first partition wall layer L1 may be prevented, thereby further improving the reliability of the display device DD.

Referring to FIG. 8H, in the performing of the second etching on the first preliminary partition wall layer L1-I, the first partition wall layer L1 and the second partition wall layer L2 may be formed. In the performing of the second etching on the first preliminary partition wall layer L1-I, the first preliminary partition wall layer L1-I may be selectively etched, so that the inner side surface of the partition wall PW may have an undercut shape in a cross-section. On the partition wall PW, a tip portion may be formed from a portion of the second partition wall layer L2 further protruding than the first partition wall layer L1 in a direction toward the center of the anode AE.

The partition wall opening OP-P may include a first region A1 and a second region A2 sequentially defined in a thickness direction (that is, a third direction DR3). The first partition wall layer L1 may include the first inner side surface S1-P defining a portion of the first region A1 of the partition wall opening OP-P, and the second partition wall layer L2 may include the second inner side surface S2-P defining the second region A2.

After this, referring to FIGS. 8H and 8I, the manufacturing method for the display panel according to this embodiment may include etching the preliminary pixel-defining film PDL-I to form a pixel-defining film PDL. The etching process of the preliminary pixel-defining film PDL-I may be performed through dry etching, and the first photoresist layer PR1 and a portion of the partition wall PW that is the second partition wall layer L2 may be used as a mask for the etching. A light-emitting opening OP-E corresponding to the partition wall opening OP-P may be formed in the pixel-defining film PDL.

After this, referring to FIG. 8J, the manufacturing method for the display panel according to this embodiment may include etching a preliminary sacrificial pattern SP-I. The etching process of the preliminary sacrificial pattern SP-I may be performed through wet etching, and the first photoresist layer PR1 and a portion of the partition wall PW that is the second partition wall layer L2 may be used as a mask for the etching.

A sacrificial opening OP-S overlapping the light-emitting opening OP-E may be formed in the sacrificial pattern SP that is formed by etching the preliminary sacrificial pattern SP-I. At least a portion of the anode AE may be exposed from the sacrificial pattern SP and the pixel-defining film PDL through the sacrificial opening OP-S and the light-emitting opening OP-E. The sacrificial pattern SP may include amorphous transparent conductive oxide. In an embodiment, the sacrificial pattern SP may be aluminum (Al)-doped zinc oxide ($ZnO_x$), for example.

The etching process of the sacrificial pattern SP may be performed in a condition where the etch selectivity between the sacrificial pattern SP and the anode AE is large. Through this, it may be possible to prevent the anode AE from being etched together. That is, by disposing the sacrificial pattern SP, which is relatively high in etch rate than the anode AE, between the pixel-defining film PDL and the anode AE, it may be possible to prevent the anode AE from being etched together and damaged during the etching process.

In addition, the etching process of the sacrificial pattern SP may be performed in a condition where the etch selectivity between the sacrificial pattern SP and the first and second partition wall layers L1 and L2 of the partition wall PW is large, and accordingly, it may be possible to prevent the first and second partition wall layers L1 and L2 from being etched together.

After this, referring to FIG. 8K, the manufacturing method for the display panel according to this embodiment may include, after removing the first photoresist layer PR1, forming a light-emitting pattern EP, forming a cathode CE, and forming a capping pattern CP.

The forming of the light-emitting pattern EP, the forming of the cathode CE, and the forming of the capping pattern CP may each be performed through deposition. In an embodiment, the forming of the light-emitting pattern EP may be performed through thermal evaporation, the forming of the cathode CE may be performed through sputtering, and the forming of the capping pattern CP may be performed through thermal evaporation. However, the inventive concept is not limited thereto.

In the forming of the light-emitting pattern EP, the light-emitting pattern EP may be separated by the tip portion formed on the partition wall PW, and disposed in the light-emitting opening OP-E and the partition wall opening OP-P. In the forming of the light-emitting pattern EP, a first preliminary dummy pattern D1-I spaced apart from the light-emitting pattern EP may be formed together on the partition wall PW.

In the forming of the cathode CE, the cathode CE may be separated by the tip portion formed on the partition wall PW, and disposed in the partition wall opening OP-P. The cathode CE may be provided with an angle of incidence higher than that of the light-emitting pattern EP, and formed to contact the first inner side surface S1-P of the first partition wall layer L1. In the forming of the cathode CE, a second preliminary dummy pattern D2-I spaced apart from the cathode CE may be formed together on the partition wall PW. The anode AE, the light-emitting pattern EP, and the cathode CE may constitute a light-emitting element ED.

In the forming of the capping pattern CP, the capping pattern CP may be separated by the tip portion formed on the partition wall PW, and disposed in the partition wall opening OP-P. In the forming of the capping pattern CP, a third preliminary dummy pattern D3-I spaced apart from the capping pattern CP may be formed together on the partition wall PW. In another embodiment of the inventive concept, the forming of the capping pattern CP may be omitted.

The first to third preliminary dummy patterns D1-I, D2-I, and D3-I form a preliminary dummy pattern DMP-I, and a dummy opening OP-D may be formed in the preliminary dummy pattern DMP-I. The dummy opening OP-D may include a first region AA1, a second region AA2, and a third region AA3 sequentially defined in the thickness direction (that is, third direction DR3). The first region AA1 of the dummy opening OP-D may be defined by an inner side surface of the first dummy pattern D1, the second region AA2 may be defined by an inner side surface of the second dummy pattern D2, and the third region AA3 may be defined by an inner side surface of the third dummy pattern D3.

After this, referring to FIG. 8I, the manufacturing method for the display panel according to this embodiment may include forming a preliminary lower inorganic encapsulation pattern LIL-I. The preliminary lower inorganic encapsulation pattern LIL-I may be formed through a deposition process. In an embodiment, the preliminary lower inorganic encapsulation pattern LIL-I may be formed through a chemical vapor deposition ("CVD") process. The preliminary lower inorganic encapsulation pattern LIL-I may be formed on the partition wall PW and the cathode CE, and a portion of the preliminary lower inorganic encapsulation pattern LIL-I may be formed on an inner side of the partition wall opening OP-P.

After this, referring to FIG. 8M, the manufacturing method for the display panel according to this embodiment may include forming a second photoresist layer PR2, patterning the preliminary lower inorganic encapsulation pattern LIL-I (refer to FIG. 8I) for a lower inorganic encapsulation pattern LIL to be formed, and patterning the preliminary dummy patterns DMP-I (refer to FIG. 8I) for dummy patterns DMP to be formed.

In the forming of the second photoresist layer PR2, the second photoresist layer PR2 may be formed by forming a preliminary photoresist layer and then patterning the preliminary photoresist layer using a photo mask. Though the patterning process, the second photoresist layer PR2 may be formed in a pattern corresponding to the light-emitting opening OP-E.

In the patterning of the preliminary lower inorganic encapsulation pattern LIL-I, the preliminary lower inorganic encapsulation pattern LIL-I may be dry etched, and patterned such that portions of the preliminary lower inorganic encapsulation pattern LIL-I overlapping the remaining anodes, except for the corresponding anode AE, are removed. In an embodiment, when the preliminary lower inorganic encapsulation pattern LIL-I corresponds to the first anode AE1 (refer to FIG. 6), portions of the preliminary lower inorganic encapsulation pattern LIL-I overlapping the second and third anodes AE2 and AE3 (refer to FIG. 6) may be removed, for example.

The lower inorganic encapsulation pattern LIL overlapping the corresponding light-emitting opening OP-E may be formed from the patterned preliminary lower inorganic encapsulation pattern LIL-I. A portion of the lower inorganic encapsulation pattern LIL may be disposed in the partition wall opening OP-P to cover the light-emitting element ED, and another portion of the lower inorganic encapsulation pattern LIL may be disposed on the partition wall PW.

In the patterning of the preliminary dummy patterns DMP-I, the first to third preliminary dummy patterns D1-I, D2-I, and D3-I may be dry etched, and patterned such that portions of the first to third preliminary dummy patterns D1-I, D2-I, and D3-I overlapping the remaining anodes, except for the corresponding anode AE, are removed. In an embodiment, when the first to third preliminary dummy patterns D1-I, D2-I, and D3-I correspond to the first anode AE1 (refer to FIG. 6), portions of the first to third preliminary dummy patterns D1-I, D2-I, and D3-I overlapping the second and third anodes AE2 and AE3 (refer to FIG. 6) may be removed, for example.

The first to third dummy patterns D1, D2, and D3 overlapping the corresponding light-emitting openings OP-E may be formed from the patterned first to third preliminary dummy patterns D1-I, D2-I, and D3-I, and therefore, the dummy patterns DMP each including the first to third dummy patterns D1, D2, and D3 may be formed. The first to third dummy patterns D1, D2, and D3 may have a shape of a closed-line surrounding the corresponding light-emitting region PXA (refer to FIG. 5) in a plan view.

After this, referring to FIG. 8N, the manufacturing method for the display panel according to this embodiment may include completing the display panel DP by removing the second photoresist layer PR2 (refer to FIG. 8M) and then forming an organic encapsulation film OL and an upper inorganic encapsulation film UIL. The organic encapsulation film OL may be formed by applying an organic material through an inkjet, but the inventive concept is not limited thereto. The organic encapsulation film OL provides a flattened upper surface. After this, the upper inorganic encapsulation film UIL may be formed by depositing an inorganic material. Through this, the display panel DP including a base layer BL, a circuit element layer DP-CL, a display element layer DP-OLED, and a thin-film encapsulation layer TFE may be formed.

Between the forming of the lower inorganic encapsulation pattern LIL and the completing of the display panel DP, forming a partition wall opening and a light-emitting opening corresponding to the light-emitting regions of different colors in the partition wall PW and the pixel-defining film PDL, forming light-emitting elements providing different colors, and forming an lower inorganic encapsulation pattern covering the light-emitting elements providing different colors may further be performed. Through this, as illustrated in FIG. 6, it may be possible to form the display panel DP including the first to third light-emitting elements ED1, ED2, and ED3, the first to third capping patterns CP1, CP2, and CP3, the (1-1)-th to (1-3)-th dummy patterns D1-1, D1-2, and D1-3, the (2-1)-th to (2-3)-th dummy patterns D2-1, D2-2, and D2-3, the (3-1)-th to (3-3)-th dummy patterns D3-1, D3-2, and D3-3, and the first to third lower inorganic encapsulation patterns LIL1, LIL2, and LIL3.

A display panel in an embodiment of the inventive concept may have improved process reliability as etching selectivity of an aluminum alloy film may be improved in the etching of a partition wall.

Although the embodiments of the inventive concept have been described, it is understood that the inventive concept should not be limited to these embodiments but various changes and modifications may be made by one ordinary skilled in the art within the spirit and scope of the inventive concept as hereinafter claimed. Therefore, the technical scope of the inventive concept should not be limited to the contents described in the detailed description of the specification, but should be defined by the claims.

What is claimed is:

1. A display panel, comprising:
a base layer;
a pixel-defining film which is disposed on the base layer, and in which a light-emitting opening is defined;
a partition wall which is disposed on the pixel-defining film, and in which a partition wall opening corresponding to the light-emitting opening is defined, the partition wall including:
a first partition wall layer having first metal including at least one of germanium or copper, aluminum, and nickel, and
a second partition wall layer disposed on the first partition wall layer, and having second metal or a silicon-based compound; and
a light-emitting element disposed in the partition wall opening and including an anode, an intermediate layer, and a cathode in contact with the partition wall.

2. The display panel of claim 1, wherein a content of the first metal with respect to an entirety of the first partition wall layer is about 0.1 at % to about 0.5 at %.

3. The display panel of claim 1, wherein a content of the nickel with respect to an entirety of the first partition wall layer is about 0.5 at % to about 2.0 at %.

4. The display panel of claim 1, wherein the first partition wall layer further comprises lanthanum.

5. The display panel of claim 4, wherein a content of the lanthanum with respect to an entirety of the first partition wall layer is about 0.3 at % to about 0.5 at %.

6. The display panel of claim 1, wherein the second partition wall layer has an undercut shape protruding from one side of the first partition wall layer.

7. The display panel of claim 1, wherein the second partition wall layer comprises titanium.

8. The display panel of claim 1, wherein the first partition wall layer is directly disposed on the pixel-defining film, and
the second partition wall layer is directly disposed on the first partition wall layer.

9. The display panel of claim 1, wherein the partition wall opening comprises a first region in which the light-emitting element is disposed, and a second region having a smaller width than a width of the first region,
an inner side surface of the first partition wall layer defines the first region, and
an inner side surface of the second partition wall layer defines the second region.

10. The display panel of claim 1, wherein the first partition wall layer has a thickness of about 6000 angstroms to about 100000 angstroms, and
the second partition wall layer has a thickness of about 400 angstroms to about 800 angstroms.

11. The display panel of claim 1, further comprising a sacrificial pattern which is disposed between the anode and the pixel-defining film, and in which a sacrificial opening overlapping the light-emitting opening is defined.

12. The display panel of claim 1, wherein the cathode contacts the first partition wall layer.

13. The display panel of claim 1, further comprising a thin-film encapsulation layer disposed on the light-emitting element, and including a plurality of thin films,
wherein the thin-film encapsulation layer includes an inorganic encapsulation pattern which covers the light-emitting element, and a portion of which contacts the partition wall.

14. A display panel comprising:

a base layer;

a pixel-defining film which is disposed on the base layer, and in which a light-emitting opening is defined;

a partition wall which is disposed on the pixel-defining film, and in which a partition wall opening corresponding to the light-emitting opening is defined, the partition wall including:

a first partition wall layer including aluminum, nickel, and first metal having a standard reduction potential higher than a standard reduction potential of the nickel, and a second partition wall layer disposed on the first partition wall layer, and having an undercut shape protruding from one side of the first partition wall layer; and a light-emitting element disposed in the partition wall opening and including an anode, an intermediate layer, and a cathode in contact with the partition wall.

15. The display panel of claim 14, wherein the first partition wall layer further comprises lanthanum.

16. The display panel of claim 15, wherein the first partition wall layer comprises an aluminum-nickel-lanthanum-germanium alloy, or an aluminum-nickel-lanthanum-copper alloy.

17. A manufacturing method for a display panel, comprising:

providing a preliminary display panel including a base layer, an anode disposed on the base layer, and a preliminary pixel-defining film disposed on the base layer and covering the anode;

forming a first preliminary partition wall layer including first metal including at least one of germanium or copper, aluminum, and nickel;

forming, on the first preliminary partition wall layer, a second preliminary partition wall layer including second metal or a silicon-based compound;

etching the first and second preliminary partition wall layers and forming a partition wall in which a partition wall opening is defined; and forming, in the partition wall opening, a light-emitting pattern, and a cathode which contacts the partition wall.

18. The manufacturing method of claim 17, wherein the forming the partition wall comprises:

performing a first etching on the first and second preliminary partition wall layers; and performing a second etching on the first preliminary partition wall layer by providing an alkaline chemical solution to the first preliminary partition wall layer.

19. The manufacturing method of claim 18, wherein in the performing the second etching on the first preliminary partition wall layer, a first partition wall layer and a second partition wall layer are formed, and an inner side surface of the second partition wall layer is closer to a center of the anode than an inner side surface of the first partition wall layer is to the center of the anode.

20. The manufacturing method of claim 18, wherein the alkaline chemical solution comprises at least one of potassium hydroxide or tetramethylammonium hydroxide.

21. An electronic device comprising:

a display panel comprising:

a base layer;

a pixel-defining film which is disposed on the base layer, and in which a light-emitting opening is defined;

a partition wall which is disposed on the pixel-defining film, and in which a partition wall opening corresponding to the light-emitting opening is defined, the partition wall including:

a first partition wall layer having first metal including at least one of germanium or copper, aluminum, and nickel, and a second partition wall layer disposed on the first partition wall layer, and having second metal or a silicon-based compound; and a light-emitting element disposed in the partition wall opening and including an anode, an intermediate layer, and a cathode in contact with the partition wall.

* * * * *